US012575309B2

(12) United States Patent
Takeya et al.

(10) Patent No.: US 12,575,309 B2
(45) Date of Patent: Mar. 10, 2026

(54) PRODUCTION METHOD FOR PATTERNED ORGANIC FILM, PRODUCTION APPARATUS FOR PATTERNED ORGANIC FILM, ORGANIC SEMICONDUCTOR DEVICE PRODUCED BY SAME, AND INTEGRATED CIRCUIT INCLUDING ORGANIC SEMICONDUCTOR DEVICE

(71) Applicant: THE UNIVERSITY OF TOKYO, Tokyo (JP)

(72) Inventors: Junichi Takeya, Tokyo (JP); Shunichiro Watanabe, Tokyo (JP); Mari Sasaki, Tokyo (JP); Tatsuyuki Makita, Tokyo (JP)

(73) Assignee: THE UNIVERSITY OF TOKYO, Tokyo (JP)

( * ) Notice: Subject to any disclaimer, the term of this patent is extended or adjusted under 35 U.S.C. 154(b) by 662 days.

(21) Appl. No.: 17/905,941

(22) PCT Filed: Mar. 10, 2021

(86) PCT No.: PCT/JP2021/009658

§ 371 (c)(1),
(2) Date: Sep. 9, 2022

(87) PCT Pub. No.: WO2021/182545

PCT Pub. Date: Sep. 16, 2021

(65) Prior Publication Data

US 2023/0165123 A1 May 25, 2023

(30) Foreign Application Priority Data

Mar. 10, 2020 (JP) ................................ 2020-040647

(51) Int. Cl.
*H10K 71/18* (2023.01)
*H10K 10/46* (2023.01)
*H10K 71/80* (2023.01)

(52) U.S. Cl.
CPC .......... *H10K 71/18* (2023.02); *H10K 10/474* (2023.02); *H10K 71/80* (2023.02)

(58) Field of Classification Search
None
See application file for complete search history.

(56) References Cited

U.S. PATENT DOCUMENTS

2014/0191224 A1 7/2014 Takeya et al.

FOREIGN PATENT DOCUMENTS

JP 2008263038 A 10/2008
JP 201321190 A 1/2013

(Continued)

OTHER PUBLICATIONS

Amit Kumar et al., "Features of gold having micrometer to centimeter dimensions can be formed through a combination of stamping with an elastomeric stamp and an alkanethiol "ink" followed by chemical etching", Applied Physics Letters, Oct. 4, 1993, p. 2002-p. 2004, vol. 63, No. 14, American Institute of Physics, 4pp.

(Continued)

*Primary Examiner* — Anthony Ho
(74) *Attorney, Agent, or Firm* — HAUPTMAN HAM, LLP

(57) ABSTRACT

A method for producing a patterned organic film includes: forming a hydrophobic organic film on a hydrophilic and non-water-soluble first substrate using a coating method, pressing the organic film formed on the first substrate against a convex portion of a stamp having the convex portion and a concave portion, transferring the organic film to the convex portion by applying water or an aqueous solution to (Continued)

an interface between the first substrate and the organic film, and pressing the organic film transferred to the convex portion against a second substrate to transfer the organic film to the second substrate to obtain a patterned organic film, wherein at least one of the organic film and the second substrate is an organic semiconductor.

10 Claims, 29 Drawing Sheets

(56) References Cited

FOREIGN PATENT DOCUMENTS

| | | | |
|---|---|---|---|
| JP | 201338127 | A | 2/2013 |
| KR | 10-2003-0069695 | A | 8/2003 |
| WO | 03065120 | A2 | 8/2003 |

OTHER PUBLICATIONS

Jong-Hyun Ahn et al., "Heterogeneous Three-Dimensional Electronics by Use of Printed Semiconductor Nanomaterials", Science, Dec. 15, 2006, p. 1754-p. 1757, vol. 314, 5pp.

Yueh-Lin Loo et al., "Additive, nanoscale patterning of metal films with a stamp and a surface chemistry mediated transfer process: Applications in plastic electronics", Applied Physics Letters, Jul. 2, 2002, p. 562-p. 564, vol. 81, No. 3, American Institute of Physics, 4pp.

Vth: -10.3 V
Mobility: 10.7 $cm^2$/Vs

Vth : −11.9 V

Mobility : 9.92 $cm^2/Vs$

Vth : -29.2 V
Mobility : 7.18 $cm^2/Vs$

Transfer characteristics in linear region

Vth : −40.1 V

Mobility : 16.8 $cm^2/Vs$

| Clock | Data | Q | QB |
|---|---|---|---|
| ↓ | H | H | L |
| ↓ | L | L | H |
| ↑ | H | Hold | Hold |
| ↑ | L | Hold | Hold |

PRODUCTION METHOD FOR PATTERNED ORGANIC FILM, PRODUCTION APPARATUS FOR PATTERNED ORGANIC FILM, ORGANIC SEMICONDUCTOR DEVICE PRODUCED BY SAME, AND INTEGRATED CIRCUIT INCLUDING ORGANIC SEMICONDUCTOR DEVICE

RELATED APPLICATIONS

The present application is a National Phase of International Application No. PCT/JP2021/009658 filed Mar. 10, 2021, which claims priority to Japanese Application No. 2020-040647, filed Mar. 10, 2020.

FIELD

The present disclosure relates to a production method and a production apparatus for a patterned organic film, and to an organic semiconductor device and an integrated circuit including the organic semiconductor device produced thereby.

BACKGROUND

In recent years, interest in organic semiconductors has been increasing. As features of organic semiconductors, unlike conventional inorganic semiconductors of amorphous silicon and polycrystalline silicon, it mentions that it is excellent in flexibility, that it can be inexpensively enlarged in area by roll to roll processing, etc., and applications of organic semiconductors as post-silicon semiconductors to electronic devices of the next generation type are examined.

In addition, organic semiconductors are capable of device fabrication using low-cost solution processes, and are attracting attention as a basic element of next-generation electronic devices, which are important in the Internet of Things (IoT) society. In circuit applications for industrialization, in particular, in logic circuit applications of organic field effect transistors, patterning of an organic semiconductor film (hereinafter also referred to as a semiconductor film) is indispensable.

Typical examples of the semiconductor film patterning method reported so far include a method of forming a semiconductor film only in a necessary place, or a method of forming a film on the entire surface and then etching using a photolithography process or the like.

Examples of a method for patterning a semiconductor film include laser etching, photolithography (dry etching using plasma), and photolithography (wet etching).

In addition, as a patterning method of fine electrodes or the like, Nanotransfer printing (nTP) has been proposed (Non-Patent Literature 1).

CITATION LIST

Non-Patent Literature

[NPL 1] A. Rogers et al., Appl. Phys. Lett. 81,562(2002).

SUMMARY

Technical Problem

Laser etching in which a semiconductor film is etched by a laser is expensive, and the insulating film or the like as a base is easily damaged by the laser.

In photolithography performed by dry etching using plasma, high resolution can be obtained and high reliability can be obtained, but it is high in cost, and there is a possibility that the base is damaged by plasma, such as scraping of the base.

In photolithography performed by wet etching using a solvent, high resolution can be obtained and the reliability is relatively high, but it is high in cost, there is a possibility that the base is swollen, and a portion to be left after the photolithography sometimes flows. In addition, it is difficult to select an appropriate solvent depending on a material of the semiconductor.

In nTP, Au/Ti (Ti is on top) is deposited on an entire surface of an uneven stamp, both a glass substrate as the transfer destination and the Au/Ti are plasma treated or otherwise treated to form hydroxyl groups on the surfaces, and then adhered to each other with the hydroxyl groups formed. The hydroxyl groups are chemically bonded to each other, and the Au/Ti pattern of the convex portions of the stamp is transferred onto the glass substrate.

In nTP, an expensive photolithographic apparatus and a resist are no longer necessary as long as the mold is prepared. However, since a condensation reaction between the hydroxyl groups is used, the material is limited to a material in which a hydroxyl group can be formed on the surface, and is not versatile, and cannot be used for transferring an organic semiconductor.

When a film is formed only at a necessary portion, there is a problem in that it is difficult to control a crystal growth direction important for obtaining high-performance electrical characteristics.

When etching is performed after forming a film on the entire surface, although it is possible to fabricate a circuit using a high-performance semiconductor film, since plasma and an organic solvent are used as the etching method, concern about damage to a lower layer of the semiconductor film, and selection of an organic solvent depending on the organic semiconductor material are necessary.

In view of the above, as a patterning method, there are demands that it can be patterned without damaging the organic semiconductor film, that it does not damage the underlying substrate, the insulating film, or the like, that it can be applied to a wide variety of organic materials, in particular, organic semiconductor materials, and that it has low cost.

Solution to Problem

The present inventors have found a method in which, after transferring an organic film on a film onto a convex portion of a stamp in which an uneven portion is patterned, only the organic film on the convex portion is transferred to a target substrate by pressing the stamp on the target substrate, and patterning is performed.

The gist of the present invention is as follows.

(1) A method for producing a patterned organic film, comprising:

forming a hydrophobic organic film on a hydrophilic and non-water-soluble first substrate using a coating method, pressing the organic film formed on the first substrate against a convex portion of a stamp having the convex portion and a concave portion, transferring the organic film to the convex portion by applying water or an aqueous solution to an interface between the first substrate and the organic film, and pressing the organic film transferred to the convex portion against a second substrate to transfer the organic film to the second substrate to obtain a patterned organic film, wherein at least one of the organic film and the second substrate is an organic semiconductor.

(2) The method according to (1) above, wherein a distance between an uppermost portion of the convex portion and a lowest portion of the concave portion is 2 to 100 μm.

(3) The method according to (1) or (2) above, wherein the patterned organic film comprises 10 or more organic films, each organic film has a thickness of 2 nm or more, a width of 500 nm or more, and a length of 500 nm or more, and a distance between adjacent organic films is 1 μm or more.

(4) An apparatus for producing a patterned organic film, comprising:

a stamp disposing part configured to dispose a stamp having a convex portion and a concave portion, a first substrate disposing part configured to dispose a hydrophilic and non-water-soluble first substrate having an organic film on a surface of the first substrate, a second substrate disposing part configured to dispose a second substrate, a first driving part configured to move at least one of the first substrate and the stamp so as to press the organic film on the first substrate against the convex portion of the stamp to dispose the organic film on the convex portion and to separate the first substrate from the organic film disposed on the convex portion, a first control part configured to control a force of pressing the organic film on the first substrate against the convex portion of the stamp, a supply part of water or an aqueous solution configured to supply the water or aqueous solution to an interface between the organic film and the first substrate, a second driving part configured to move at least one of the stamp and the second substrate so as to press the organic film disposed on the convex portion of the stamp against the second substrate to dispose the patterned organic film on the second substrate and to separate the stamp from the patterned organic film disposed on the second substrate, and a second control part configured to control a force of pressing the organic film disposed on the convex portion of the stamp against the second substrate.

(5) The apparatus according to (4) above, wherein the first control part is configured to control a distribution of the force of pressing the organic film in a plane of the organic film when the organic film is pressed against the convex portion.

(6) The apparatus according to (4) or (5) above, wherein the second control part is configured to control a distribution of the force of pressing the organic film in a plane of the organic film when the organic film is pressed against the second substrate.

(7) The apparatus according to any one of (4) to (6) above, wherein the apparatus comprises an amount adjusting part configured to be able to adjust the amount of the water or aqueous solution supplied by the supply part of the water or aqueous solution.

(8) The apparatus according to any one of (4) to (7) above, wherein the apparatus comprises a supply position adjusting part capable of recognizing a position of the interface for supplying the water or aqueous solution, and adjusting the position of the water or aqueous solution supplied by the supply part of the water or aqueous solution.

(9) The apparatus according to any one of (4) to (8) above, wherein the apparatus comprises a first alignment part controlling a position at which the organic film on the first substrate is pressed against the convex portion of the stamp.

(10) The apparatus according to any one of (4) to (9) above, wherein the apparatus comprises a second alignment part controlling a position at which the organic film on the convex portion of the stamp is pressed against the second substrate.

(11) An organic semiconductor device comprising:

a substrate, and a patterned organic film on the substrate, wherein the organic film is hydrophobic, at least one of the organic film and the substrate is an organic semiconductor, and the substrate is free of damage caused by patterning of the organic film.

(12) The organic semiconductor device according to (11) above, wherein the patterned organic film comprises 10 or more organic films, each organic film has a thickness of 2 nm or more, a width of 500 nm or more, and a length of 500 nm or more, and a distance between adjacent organic films is 1 μm or more.

(13) The organic semiconductor device according to (11) or (12) above, wherein the patterned organic film is an organic semiconductor single crystal film having a single domain of 0.0001 $mm^2$ or more.

(14) The organic semiconductor device according to any one of (11) to (13) above, comprising an electrode in at least a part between the substrate and the organic film, at least a part of the side of the organic film opposite to the substrate, or both.

(15) The organic semiconductor device according to (14) above, comprising a space between the substrate, the organic film, and the electrode.

(16) An integrated circuit comprising the organic semiconductor device according to any one of (11) to (15) above.

Advantageous Effects of Invention

According to the method of the present disclosure, it is possible to pattern the organic film at low cost without damaging the organic film and the base thereof by an organic solvent, plasma, or the like. Further, since the method of the present disclosure is a physical patterning method utilizing unevenness, it can be applied to a wide variety of organic materials, in particular, organic semiconductor materials.

DESCRIPTION OF EMBODIMENTS

Figure 1:
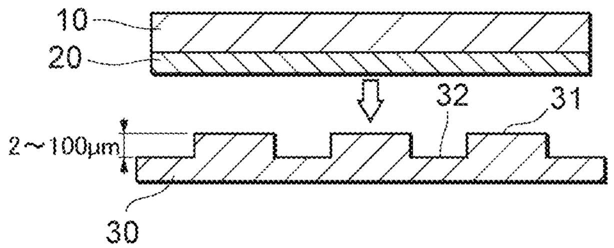
FIG. 1 is a cross-sectional schematic drawing showing a step of pressing the organic film on the first substrate against the convex portion of the stamp.

The present disclosure is directed to a method for producing a patterned organic film, comprising: forming a hydrophobic organic film on a hydrophilic and non-water-soluble first substrate using a coating method, pressing the organic film formed on the first substrate against a convex portion of a stamp having the convex portion and a concave portion, transferring the organic film to the convex portion by applying water or an aqueous solution to an interface between the first substrate and the organic film, and pressing the organic film transferred to the convex portion against a second substrate to transfer the organic film to the second substrate to obtain a patterned organic film, wherein at least one of the organic film and the second substrate is an organic semiconductor.

The production method of the present disclosure mainly has the following remarkable effects. If a mold is prepared, photolithography is unnecessary and cost is low. Since the patterning of the organic film can be performed simultaneously with the transfer to the stamp, the patterning can be performed in a short time. Since the patterning of the organic film is physically performed using the uneven portion of the stamp, it is unnecessary to use a solvent or a laser, various organic materials can be patterned, and versatility is high. Since only the stamp is pressed against the second substrate, damage to the second substrate by a solvent or the like is not caused. For example, even when the second substrate is soluble in a solvent which dissolves an organic material, a patterned organic film can be formed. Since only water or an aqueous solution is in contact with the stamp, and there is no need to contact or heat the solvent, there is substantially no swelling or shrinkage of the stamp due to the solvent or heat. For example, a film which is coated in advance and becomes single crystal can be patterned. Unlike nTP, bonding with hydroxyl groups with a transfer destination substrate is not required.

In addition, conventionally, when a semiconductor film is formed by photolithography, a mask is necessary on a material to be etched, and patterned electrodes are often used as a mask for photolithography. However, when the patterned electrodes are disposed below the semiconductor film, the electrodes cannot be used as a mask, and a mask that does not damage the semiconductor film needs to be separately prepared. According to the method of the present disclosure, even if the patterned electrode is disposed below the semiconductor film, no additional step is required, and a semiconductor film patterned on the electrode can be obtained.

Further, as compared with a conventional method of forming a semiconductor film only in a necessary portion, according to the production method of the present disclosure, it is possible to use a single crystal domain having a uniform crystal growth direction, so that it can be expected to exhibit high carrier conductivity characteristics. Further, as compared with the case of using a photolithography process or the like, the production method of the present disclosure can be expected to have an effect of low cost and short operation time.

The production method of the present disclosure can be applied to a variety of semiconductor materials and underlayers while maintaining high-performance electrical characteristics of an organic film, such as an organic semiconductor single crystal or an organic semiconductor polymer, and is highly valuable for use in a mass production process in the printed electronics industry.

In the production method of the present disclosure, a water-resistant organic film is formed on a hydrophilic and non-water-soluble first substrate by a coating method. The coating method is a method in which an organic material is dissolved in an organic solvent to prepare an organic solution, the organic solution is applied on a substrate, and the organic solvent is evaporated to form a film. As the organic solvent, an organic solvent conventionally used in a coating method can be used, and for example, toluene, dichlorobenzene, or the like can be used.

As the coating method, a method conventionally used can be used, and for example, an edge casting method, a continuous edge casting method, a drop casting method, a spin coating method, a printing method (ink jet method or gravure printing method), a dispenser method, a spray method, a dip coating method, a die coater method, a roll coater method, a bar coater method, a blade coating method, or the like can be used.

The first substrate is a hydrophilic substrate having a contact angle of water of preferably 20 degrees or less, more preferably 10 degrees or less. The first substrate may be a substrate having a hydrophilic surface or a substrate subjected to a hydrophilic treatment on the surface, preferably a glass substrate or mica, more preferably a glass substrate. The glass substrate is preferably Eagle glass. The hydrophilic treatment can be performed by $UV/O_3$ treatment on a glass substrate.

The first substrate is non-water-soluble and can be, for example, mica or glass. Since the first substrate is non-water-soluble, when water or an aqueous solution is applied to the interface between the first substrate and the organic film, components of the first substrate are not eluted and do not adhere to or react with the organic film, so that a high-purity organic film can be obtained. Further, when applying water or an aqueous solution to the interface between the first substrate and the organic film, since the shape of the first substrate is maintained without collapsing, it is possible to separate the organic film from the first substrate without distorting the shape of the organic film. The non-water-soluble means that it does not substantially dissolve, decompose, or swell in water or an aqueous solution. The glass is preferably subjected to a hydrophilic treatment on the surface by UV-ozone treatment or a hydrophilic coating material or the like. The first substrate may have flexibility.

In the production method of the present disclosure, water or an aqueous solution is applied to the interface between the first substrate and the organic film to separate the organic film from the first substrate. The organic film can be a desired organic film as long as it is a hydrophobic organic film. Water or an aqueous solution enters between the hydrophilic first substrate and the molecule of the hydrophobic organic film, and the organic film can be separated from the first substrate.

In order to separate the organic film from the first substrate, water or an aqueous solution is used, and preferably an aqueous solution is used. The aqueous solution more easily enters the interface between the first substrate and the organic film than water, and the separation between the organic film and the first substrate is more promoted. The aqueous solution can be one that does not easily swell or contract the stamp, and is preferably a mixture of water and a polar solvent, such as ethanol, methanol, or acetonitrile. The concentration of the polar solvent, such as ethanol, methanol, or acetonitrile, in the aqueous solution is preferably 5 to 50%, more preferably 10 to 45%, and even more preferably 15 to 40%.

The water contact angle of the hydrophilic first substrate is smaller than the water contact angle of the hydrophobic organic film, and the difference in the water contact angle between the first substrate and the organic film is preferably 40 degrees or more, more preferably 50 degrees or more, even more preferably 60 degrees or more, even more preferably 70 degrees or more, even more preferably 80 degrees or more, and even more preferably 90 degrees or more. The contact angle of the organic film is preferably 60 degrees or more, more preferably 70 degrees or more, even more preferably 80 degrees or more, and even more preferably 100 to 120 degrees. When the difference in the contact angle between the hydrophilic first substrate and the hydrophobic organic film is within the preferable range, the organic film can be more stably peeled off from the first substrate.

The method of applying water or an aqueous solution to the interface between the first substrate and the organic film is not particularly limited, and may include dropping water or an aqueous solution using a water supplier, such as a dropper, at the interface between the first substrate and the organic film, immersing the first substrate on which the organic film is formed in water, or the like.

In the present specification, hydrophobicity may have preferably a contact angle of 50 degrees or more, more preferably a contact angle of 60 degrees or more, still more preferably a contact angle of 70 degrees or more, still more preferably a contact angle of 80 degrees or more, still more preferably a contact angle of 90 degrees or more, still more preferably 100 degrees or more, still more preferably 110 degrees or more, and still more preferably 150 degrees or more.

The area of the organic film formed on the first substrate is preferably 2 $mm^2$ or more, more preferably 10 $mm^2$ or more, even more preferably 100 $mm^2$ or more, even more preferably 1000 $mm^2$ or more, and even more preferably 10000 $mm^2$ or more. The upper limit of the area of the organic film is not particularly limited, and may be limited by the size of the production facility and may be, for example, 10 $m^2$. When used in semiconductor devices, an organic film having the above preferable area may be used by separating the organic film into an area of 0.000025 to less than 2.0 $mm^2$, 0.0001 to less than 1.5 $mm^2$, 0.0004 to 1.0 $mm^2$, 0.0009 to 0.5 $mm^2$, 0.0016 to 0.2 $mm^2$, 0.0025 to 0.1 $mm^2$, or 0.005 to 0.05 $mm^2$, for example.

The distance between the uppermost portion of the convex portion and the lowest portion of the concave portion of the stamp is preferably 2 to 100 μm, more preferably 5 to 50 μm, even more preferably 7 to 40 μm, and even more preferably 10 to 30 μm. When the distance between the uppermost portion of the convex portion and the lowest portion of the concave portion of the stamp is within the preferable range, the physical patterning can be performed while preventing the concave portion from contacting the organic film and preventing the convex portion from breaking when pressing the stamp and the organic film.

The pressure per area of the convex portion when pressing the organic film against the convex portion of the stamp may be appropriately adjusted in a range in which the concave portion does not contact the organic film and the convex portion does not break, and may be, for example, 5 to 200 kPa, 10 to 100 kPa, or 50 to 80 kPa.

The pressure per area of the convex portion when pressing the organic film transferred to the convex portion of the stamp against the second substrate may be appropriately adjusted in the range in which the organic film is transferred to the second substrate and the convex portion is not broken, and may be, for example, 5 to 200 kPa, 10 to 100 kPa, or 50 to 80 kPa.

The constituent material of the stamp is preferably a resin, preferably polydimethylsiloxane (PDMS) or polymethylmethacrylate (PMMA), more preferably PDMS. The constituent material of the stamp may be mainly composed of PDMS or PMMA. By using the stamp composed of such a material, it is possible to transfer the organic film to the convex portion of the stamp and to favorably transfer the organic film from the convex portion of the stamp to the second substrate. The stamp may be hydrophobic. The stamp may comprise a supporting substrate of glass or film.

The supporting substrate is preferably a glass substrate, a polyethylene naphthalate (PEN) substrate, or a polyethylene terephthalate (PET) substrate.

The glass substrate, the PEN substrate, or the PET substrate (depending on the heat treatment temperature at the time of producing the stamp) can be selected based on the pressing of the stamp material before the curing and the ease of separation from the mold for producing the stamp after the heat curing. By using a flexible substrate as the base material of the stamp, separation can be easily performed.

A release layer may be formed on the surface of the stamp. The release layer is preferably CYTOP or a self-assembled monolayer (SAM), more preferably CYTOP. The self-assembled monolayer is, for example, decyltrimethoxysilane (DTS), triethoxy-1H, 1H, 2H, 2H-heptadecafluorodecylsilane (F-SAM), or trimethoxy (2-phenylethyl) silane (β-PTS). Since the DTS has a contact angle of about 101 degrees, the F-SAM has a contact angle of about 110 degrees, and the β-PTS has a contact angle of about 80 degrees, when the organic film is transferred to the second substrate, the organic film is more easily peeled off from the stamp and transferred. The SAM treatment can be performed by a vapor phase method or a liquid phase method.

The patterned organic film preferably comprises 10 or more organic films, and each organic film has a thickness of 2 nm or more, a width of 500 nm or more, and a length of 500 nm or more, and a distance between adjacent organic films is 1 μm or more.

The number of the organic films included in the patterned organic film is more preferably 50 or more, more preferably 100 or more. The width and the length of the organic film can each be more preferably 10 μm or more, still more preferably 15 μm or more, still more preferably 20 μm or more, still more preferably 30 μm or more, still more preferably 45 μm or more, and still more preferably 50 μm or more. The thickness of the organic film is more preferably 2 to 100 nm, more preferably 7 to 20 nm. The distance between the adjacent organic films is more preferably 5 μm or more, even more preferably 10 μm or more, even more preferably 20 μm or more, and even more preferably 25 μm or more.

The upper limit of the width of the organic film is not particularly limited, and is, for example, 500 μm or less. The upper limit of the distance between the organic films in the organic film is not particularly limited.

Figure 22:
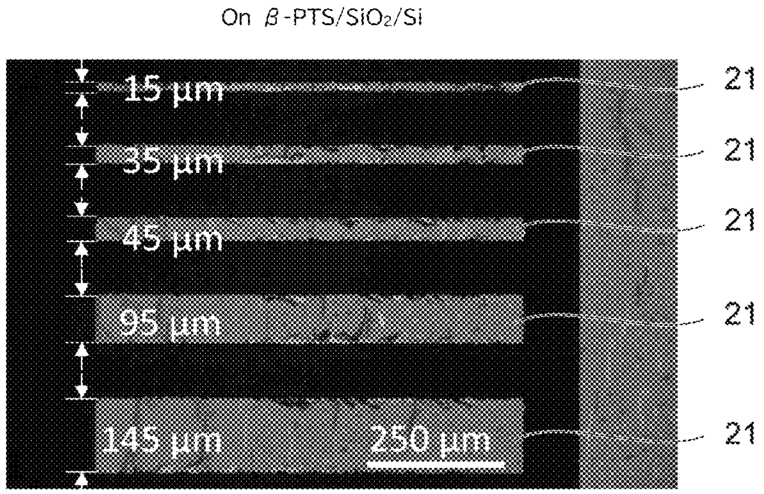
FIG. 22 is a polarized light microscopic image of a transferred organic semiconductor single crystal film observed from the top surface.
Figure 23:
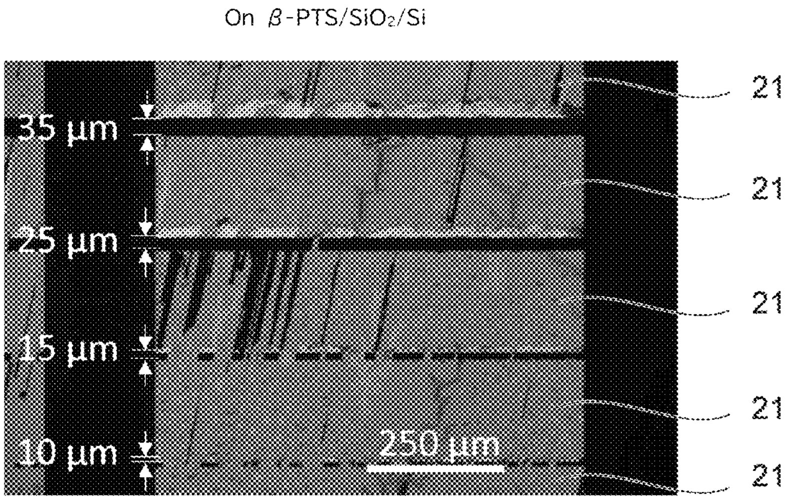
FIG. 23 is a polarized light microscopic image of a transferred organic semiconductor single crystal film observed from the top surface.
Figure 33:
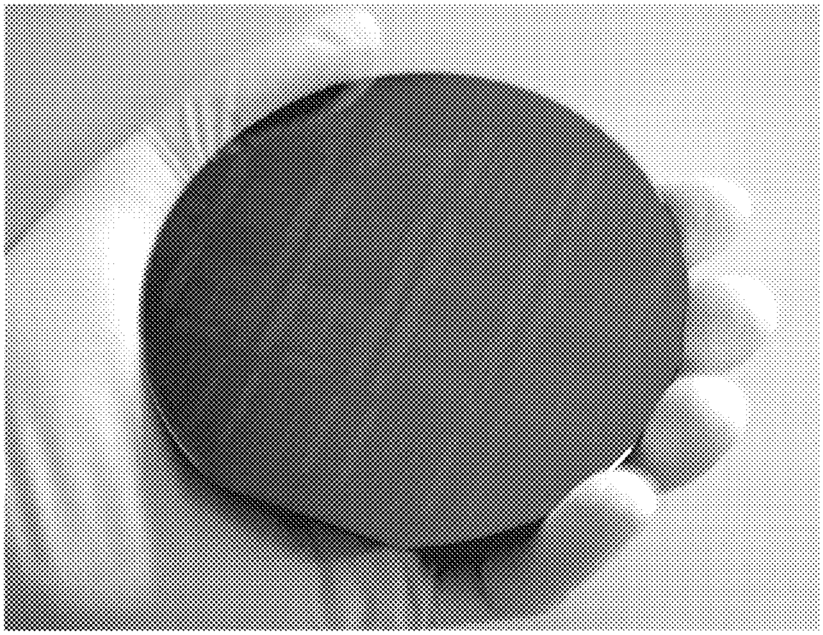
FIG. 33 is an external photograph of a 4-inch wafer having a patterned semiconductor organic film.

FIG. 22 shows top photographs of five sets of organic films as an example of the patterned organic film. FIG. 23 shows top photographs of another example of the patterned organic film, i.e., five sets of organic films. FIG. 33 shows an external photograph of a 4-inch silicon wafer having a patterned semiconductor organic film.

At least a part of the surface of the second substrate in contact with the patterned organic film may have characteristics of hydrophobicity, solvent solubility, non-heat resistance, or a combination thereof. Preferably, the entire surface of the second substrate in contact with the organic film has the characteristics of hydrophobicity, solvent solubility, non-heat resistance, or a combination thereof, and more preferably, the entire second substrate has the characteristics of hydrophobicity, solvent solubility, non-heat resistance, or a combination thereof.

The material of the second substrate is not particularly limited as long as it is a solid. The second substrate may include a plurality of layers, such as a supporting substrate, an electrode, an insulating film, or the like. The second substrate may be a flexible substrate. Examples of the flexible substrate include a polyethylene naphthalate (PEN) substrate, a polyimide substrate, a polyphenylene sulfide substrate, a silicone substrate, and the like.

At least a part of the surface of the second substrate in contact with the organic film, preferably the entire surface of the second substrate in contact with the organic film, more preferably the entire second substrate may exhibit hydrophobicity in the preferable range. By having the second substrate exhibit such hydrophobicity, when a device is produced using a patterned organic film disposed on the hydrophobic substrate, moisture (adsorbed molecules) that may be attached to the substrate can be reduced or eliminated, and a device having favorable characteristics without influence of moisture can be produced.

Examples of materials exhibiting hydrophobicity include parylene (contact angle of about 80 to 90 degrees), CYTOP (registered trademark) (contact angle of 110 degrees) which is a fluorine-based polymer, and the like.

At least a part of the surface of the second substrate in contact with the organic film, preferably the entire surface of the second substrate in contact with the organic film, more preferably the entire second substrate may be soluble in a solvent. Therefore, at least a part of the surface of the second substrate in contact with the organic film, preferably the entire surface of the second substrate in contact with the organic film, more preferably the entire second substrate may be a p-type organic semiconductor film or an n-type organic semiconductor film, or may be a laminate comprising a p-type organic semiconductor film and an n-type organic semiconductor film. Therefore, the second substrate may include a pn junction structure, a pnp junction structure, or an npn junction structure formed of an organic semiconductor film.

In the present application, the solvent solubility means substantially dissolving, decomposing, or swelling in an organic solvent, and means substantially dissolving, decomposing, or swelling with respect to an organic solvent conventionally used in a coating method, for example, toluene, dichlorobenzene, or the like.

At least a part of the surface of the second substrate in contact with the organic film, preferably the entire surface of the second substrate in contact with the organic film, more preferably the entire second substrate may be non-heat resistant. Therefore, at least a part of the surface of the second substrate in contact with the organic film, preferably the entire surface of the second substrate in contact with the organic film, more preferably the entire second substrate, may be a substrate having an electrode film of Au or the like modified with a self-assembled monolayer (SAM: self-assembled monolayer), such as pentafluorobenzenethiol (PFBT), for example. The organic film can be disposed on such a modifying material having low heat resistance, such as PFBT or the like.

In the present application, the non-heat resistance preferably means that the glass transition point is 90° C. or less, or sublimation, melting, or decomposition occurs at 90° C. or less, and more preferably means that the glass transition point is 120° C. or less, or sublimation, melting, or decomposition occurs at 120° C. or less.

The production method of the present disclosure will be described with reference to the drawings.

The hydrophobic organic film is coated on the hydrophilic and non-water-soluble first substrate by the coating method. Next, as shown in FIG. 1, the organic film 20 on the first substrate 10 is pressed against the convex portion 31 of the stamp 30. The stamp 30 has a convex portion 31 and a concave portion 32.

Figure 2:
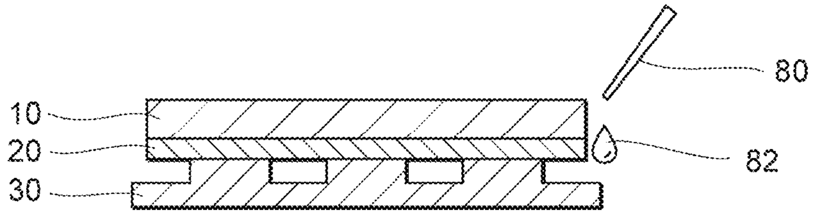
FIG. 2 is a cross-sectional schematic drawing showing a step of applying water or an aqueous solution to the interface between the first substrate and the organic film.

As shown in FIG. 2, water or an aqueous solution is applied to the interface between the first substrate 10 and the organic film 20 while the organic film 20 on the first substrate 10 is in close contact with the convex portion of the stamp 30. FIG. 2 shows an embodiment in which the water or aqueous solution is applied to the interface between the first substrate 10 and the organic film 20 using a water or aqueous solution supplier 80, such as a dropper.

Figure 3:
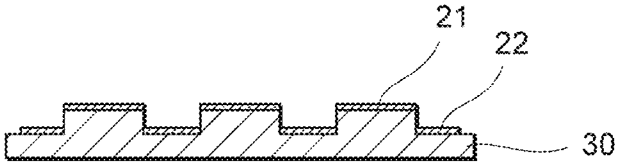
FIG. 3 is a cross-sectional schematic drawing of the organic film transferred on the convex portion of the stamp.

Thereby, the water or aqueous solution enters between the hydrophilic glass substrate and the highly water-repellent organic film, the organic film is peeled off from the substrate, and the organic film 21 is transferred onto the convex portion of the stamp 30 as shown in FIG. 3. When transferring the organic film onto the convex portion of the stamp, the organic film 22 may be transferred to the concave portion as illustrated in FIG. 3.

Figure 4:
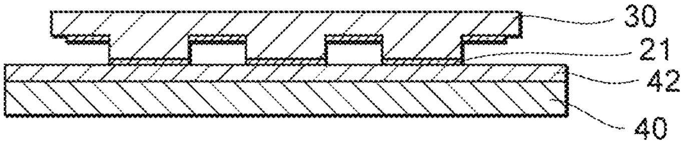
FIG. 4 is a cross-sectional schematic drawing showing a step of pressing the organic film transferred to the convex portion against the second substrate.
Figure 5:
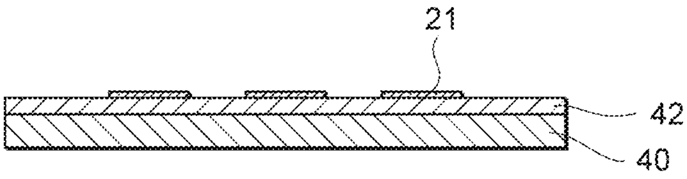
FIG. 5 is a cross-sectional schematic drawing of the patterned organic film transferred to the second substrate.

Next, as shown in FIG. 4, the organic film 21 transferred to the convex portion is pressed against the second substrate 40, and as shown in FIG. 5, the organic film 21 is transferred onto the second substrate 40 to obtain a patterned organic film. The second substrate 40 may have a hydrophobic film 42.

(Mold Preparation)

The stamp used in the production method of the present disclosure can be produced using a mold. The mold for producing the stamp can be prepared by a conventional method. An example of a method for preparing a mold is shown below.

A substrate is prepared. The substrate can be a substrate subjected to a hydrophilic treatment on the surface, and a glass substrate is preferred. When the surface is hydrophilic, the adhesion of the photoresist can be improved. The glass substrate is preferably Eagle glass. The hydrophilic treatment can be performed by $UV/O_3$ treatment or plasma-treatment on the glass substrate.

Figure 6:
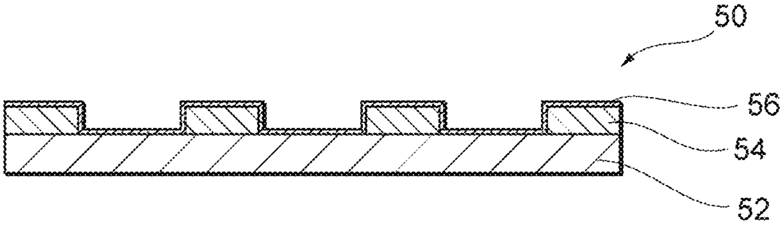
FIG. 6 is a cross-sectional schematic drawing of a photoresist formed on a glass substrate, and a self-assembled molecular film formed on the glass substrate and the photoresist in a preparation process of a mold.

As shown in FIG. 6, after spin-coating a photoresist solution on the glass substrate 52 having a hydrophilic surface, heat treatment is performed, and a mask having a predetermined pattern is formed and exposed. The photoresist is preferably SU-8. The SU-8 can form a photoresist having a height of 10 μm or more and a spacing of 1 μm or less or 100 nm or less.

After the exposure, heat treatment is performed at a low temperature, development is performed, and heat treatment is performed at a high temperature. Next, F-SAM treatment or the like by a vapor phase method may be performed to form a release layer, and a mold 50 of the glass substrate 52 on which the photoresist 54 having the release layer 56 is formed can be prepared.

(Stamp Production)

The stamp used in the production method of the present disclosure can be produced as follows using the prepared mold 50. An example of a method for producing the stamp is shown below.

Figure 7:
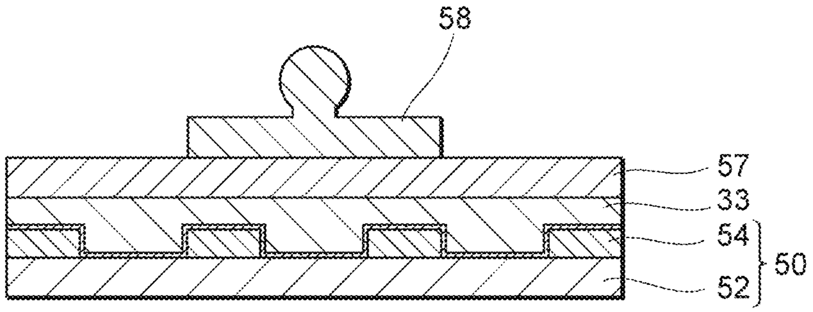
FIG. 7 is a cross-sectional schematic drawing of a stamp producing process using a mold.
Figure 8:
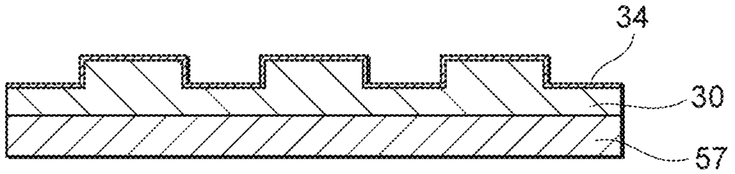
FIG. 8 is a cross-sectional schematic drawing of the stamp.

As shown in FIG. 7, a liquid stamp material 33 is dropped on the mold 50, a weight 58 is put on the mold 50 by being sandwiched by a supporting substrate 57, allowed to stand, and subjected to heat curing, and then the mold is peeled off to produce a stamp 30 as shown in FIG. 8. The stamp material may be agitated and defoamed prior to being dropped into the mold.

In order to improve the peelability of the organic film, as shown in FIG. 8, a release layer 34 of CYTOP or the like may be formed on the surface of the produced stamp. The release layer is formed by spin coating a solution containing a material of the release layer, and then performing heat treatment.

The organic film can be, for example, an organic film of PMMA or the like, an organic semiconductor film, an organic semiconductor single crystal film, or an organic semiconductor polymer film. The organic film is preferably an organic semiconductor film, more preferably an organic semiconductor single crystal film or an organic semiconductor polymer film, and still more preferably an organic semiconductor single crystal film. The organic semiconductor includes a p-type organic semiconductor, an n-type organic semiconductor, or a combination thereof.

When the organic film is an organic semiconductor single crystal film, the average film thickness of the organic semiconductor single crystal film is 2 to 100 nm, preferably 4 to 20 nm. By having the average film thickness of the organic semiconductor single crystal film in the range, good device characteristics can be obtained. The average film thickness of the organic semiconductor single crystal film can be measured using a stylus type surface profile measuring instrument or an atomic force microscope.

The organic semiconductor single crystal film preferably has 1 molecular layer to 50 molecular layers, more preferably 1 molecular layer to 10 molecular layers, and still more preferably 1 molecular layer to 5 molecular layers in the thickness direction. The organic semiconductor single crystal film most preferably has one molecular layer, but may have two or more molecular layers in the thickness direction. The number of molecular layers of the organic semiconductor single crystal film can be measured by an atomic force microscope.

The thickness of one molecular layer of the organic semiconductor single crystal film is preferably 2 to 6 nm, more preferably 2 to 4 nm. The thickness of one molecular layer of the organic semiconductor single crystal film can be measured by combining single crystal X-ray structure analysis with atomic force microscope observation.

The organic semiconductor single crystal film is composed of a single domain or multi-domain, and preferably is composed of a single domain. The domain of the organic semiconductor single crystal film can be measured by single crystal X-ray diffraction. The organic semiconductor single crystal film preferably has a single domain with a contiguous area of 0.0001 $mm^2$ or more, more preferably 0.0004 $mm^2$ or more, still more preferably 0.0009 $mm^2$ or more, still more preferably 0.0016 $mm^2$ or more, still more preferably 0.0025 $mm^2$ or more, still more preferably 0.005 $mm^2$ or more, still more preferably 0.5 $mm^2$ or more, still more preferably 2.0 $mm^2$ or more, still more preferably 4.0 $mm^2$ or more, still more preferably 100 $mm^2$ or more, still more preferably 1000 $mm^2$ or more, and still more preferably 10000 $mm^2$ or more. The fact that the organic semiconductor single crystal film having the preferable area has a single domain can be confirmed by in-plane X-ray diffraction measurement in which X-rays are irradiated on the entire organic semiconductor single crystal film having the preferable area. The area of the organic semiconductor single crystal layer may be the same as the area of the single domain described above. The single domain is a contiguous region in which crystal orientations are aligned. In the single domain, the number of molecular layers is preferably uniform, but may include regions of different molecular layers as long as the crystal orientations are uniform. For example, if a region of three molecular layers in which a layer with aligned crystal orientation has grown in a dendritic manner over part of a region of two molecular layers with aligned crystal orientation is included, the contiguous region of the two molecular layers and the three molecular layers will be a single domain.

It should be understood that the organic semiconductor single crystal film may include a separated organic semiconductor single crystal film having a single domain of the above preferable contiguous area. For example, the organic semiconductor single crystal film having the single domain of the preferable contiguous area may be separated into a plurality of pieces of the organic semiconductor single crystal film and incorporated in an organic semiconductor device. The separation of each organic semiconductor single crystal film within the organic semiconductor device allows it to be electrically isolated from other elements. The fact that each of the separated organic semiconductor single crystal films has been obtained from the single crystal film having the same direction of the crystal axis can be confirmed by measurement by single crystal X-ray diffraction or electron diffraction, or observation with a polarized light microscope.

Figure 34:
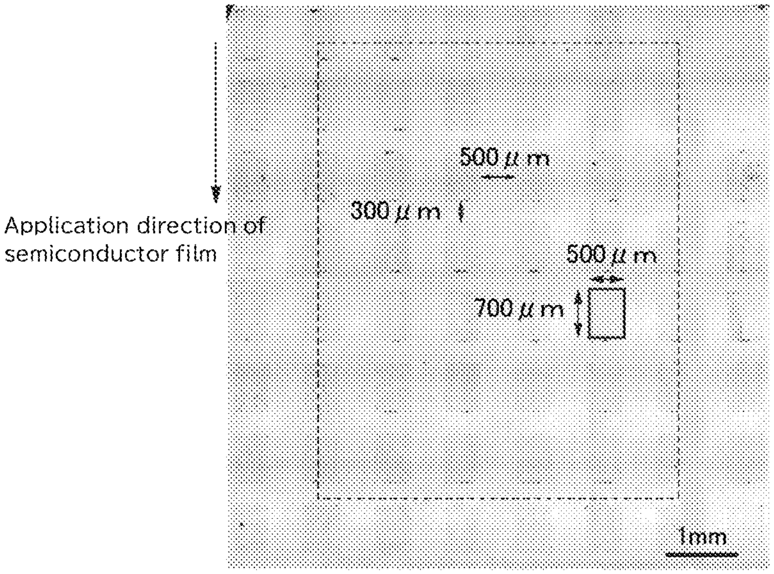
FIG. 34 is a laser confocal microscopic image of an 8×8 array of 700 μm×500 μm organic semiconductor single-crystal films transferred and patterned by the method of the present disclosure.
Figure 35:
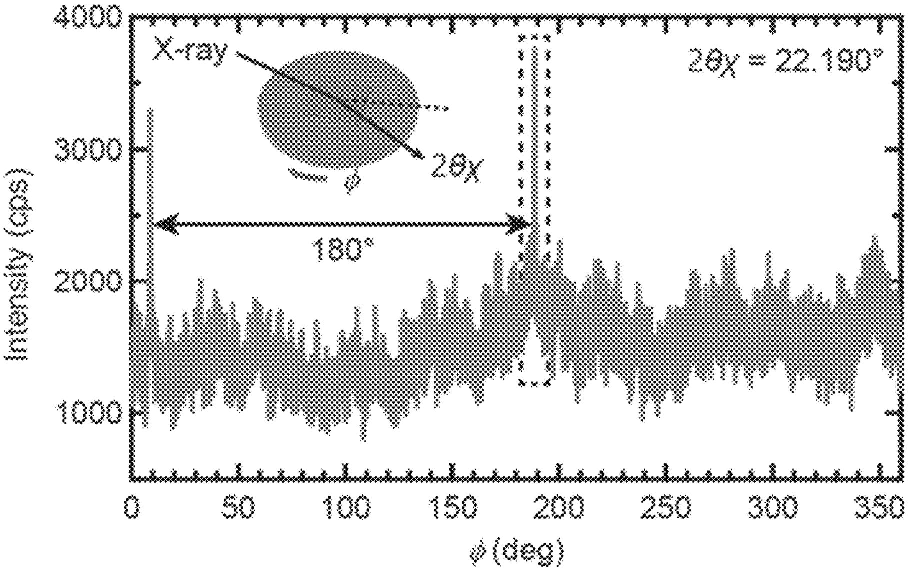
FIG. 35 is an in-plane X-ray diffraction measurement result of a portion surrounded by a broken line portion of FIG. 34.

FIG. 34 shows a laser confocal microscopic image of an array in which organic semiconductor single crystal films of 700 μm×500 μm transferred and patterned by the present method are arranged at 8×8. The portion surrounded by the square frame is one organic semiconductor single crystal film of 700 μm×500 μm, and the organic semiconductor single crystal film is aligned with 8×8 in the entire microscopic image. The spacing between the organic semiconductor single crystal films is 500 μm in the lateral direction, and 300 μm in the longitudinal direction. The in-plane X-ray diffraction measurement can be performed, for example, by irradiating X-rays to a portion surrounded by a broken line portion while rotating the substrate holding the organic semiconductor single crystal film shown in FIG. 34 by 360 degrees. As an example, as shown in FIG. 35, if a peak is observed at a cycle of 180 degrees by the in-plane X-ray diffraction measurement, it is determined that each organic semiconductor single crystal film located in the portion surrounded by the broken line portion irradiated with X-rays is a single crystal film oriented substantially in the same direction. If there is a significant variation in the orientation of the crystal, the number of diffractive peaks will not become one, and a plurality of peaks will be observed. When the organic single crystal film transferred and patterned by the present method is measured by the method described above, the half width of the diffractive peak is preferably within ±1 degrees, more preferably within ±0.5 degrees.

The organic semiconductor single crystal film exhibits mobility of preferably 0.1 $cm^2/V\cdot s$ or more, more preferably 0.5 $cm^2/V\cdot s$ or more, even more preferably 1.0 $cm^2/V\cdot s$ or more, even more preferably 3.0 $cm^2/V\cdot s$ or more, even more preferably 2.0 $cm^2/V\cdot s$ or more, even more preferably 5.0 $cm^2/V\cdot s$ or more, even more preferably 7.5 $cm^2/V\cdot s$ or more, and even more preferably 10 $cm^2/V\cdot s$ or more. The mobility of the organic semiconductor single crystal film can be calculated from the measurement results of the organic field effect transistor.

The type of the organic semiconductor constituting the organic semiconductor single crystal film is not particularly limited, and for example, a polycyclic aromatic compound of four or more rings, or a polycyclic compound of four or more rings formed of one or more unsaturated five-membered heterocyclic compounds and a plurality of benzene rings can be used.

The organic semiconductor constituting the organic semiconductor single crystal film is preferably a material having a high self-aggregation ability, such as a p-type organic semiconductor Cn-DNBDT-NW of the following formula (1) exhibiting high mobility.

[Chemical Formula 1]

(1)

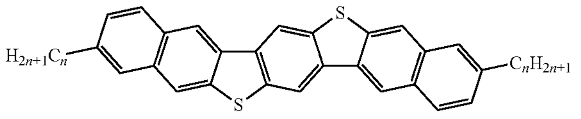

In formula (1), n may be 1 to 14. The self-aggregation ability refers to a tendency of molecules to spontaneously aggregate and crystallize as the molecules precipitate from a solvent.

Other examples of the organic semiconductor constituting the organic semiconductor single crystal film are shown in the following formulas (2) to (6).

[Chemical Formula 2]

(2)

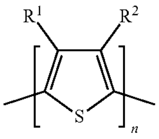

In the polythiophene semiconductor represented by Formula (2), $R^1$ and $R^2$ are each independently a hydrogen atom or an alkyl group having 4 to 10 carbon atoms. The alkyl group may comprise a heteroatom (typically selected from an oxygen atom and a sulfur atom). In addition, $R^1$ and $R^2$ together can form a ring. For reasons of self-aggregation ability, preferably, $R^1$ and $R^2$ are each independently a hydrogen atom or an alkyl group having 5 to 8 carbon atoms. More preferably, each of $R^1$ and $R^2$ is independently a hydrogen atom or a hexyl group.

The n represents an integer of 5 to 100. The n indicates the average number of thiophene monomer units in the polythiophene semiconductor, i.e., the length of the polythiophene chain. From the viewpoint of forming the single crystal film, the n is preferably 50 or less.

[Chemical Formula 3]

(3)

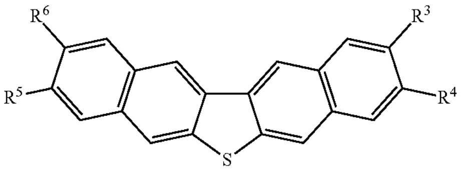

(Ii)

In Formula (3), each of $R^3$, $R^4$, $R^5$ and $R^6$ is independently a hydrogen atom or an alkyl group having 1 to 14 carbon atoms. The alkyl group may comprise a heteroatom (typically selected from an oxygen atom and a sulfur atom), and the hydrogen atom in the alkyl group may be substituted with a substituent, such as a halogen atom. For reasons of self-aggregation ability, $R^4$=$R^5$ is preferred, and $R^3$=$R^6$ is preferred. From the viewpoint of solubility, preferably, $R^4$ and $R^5$ are hydrogen atoms, and $R^3$ and $R^6$ are each independently an alkyl group having 1 to 14 carbon atoms, or $R^3$ and $R^6$ are hydrogen atoms, and $R^4$ and $R^5$ are each independently an alkyl group having 1 to 14 carbon atoms. More preferably, $R^3$ and $R^6$ are hydrogen atoms, and $R^4$ and $R^5$ are each independently an alkyl group having 1 to 14 carbon atoms. For reasons of self-aggregation ability, the carbon number of the alkyl group is preferably from 4 to 12, more preferably from 6 to 10.

[Chemical Formula 4]

(4)

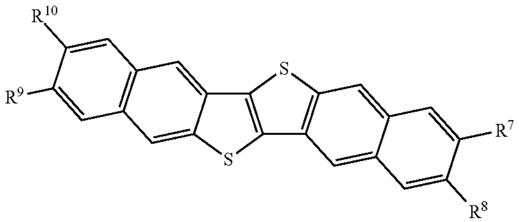

In Formula (4), each of $R^7$, $R^8$, $R^9$ and $R^{19}$ is independently a hydrogen atom or an alkyl group having 1 to 14 carbon atoms. The alkyl group may comprise a heteroatom (typically selected from an oxygen atom and a sulfur atom), and the hydrogen atom in the alkyl group may be substituted with a substituent, such as a halogen atom. For reasons of self-aggregation ability, $R^7$=$R^9$ is preferred, and $R^8$=$R^{10}$ is preferred. From the viewpoint of solubility, preferably, $R^7$ and $R^9$ are hydrogen atoms, and $R^8$ and $R^{10}$ are each independently an alkyl group having 1 to 14 carbon atoms, or $R^8$ and $R^{10}$ are hydrogen atoms, and $R^7$ and $R^9$ are each independently an alkyl group having 1 to 14 carbon atoms. More preferably, $R^8$ and $R^{10}$ are hydrogen atoms, and $R^7$ and $R^9$ are each independently an alkyl group having 1 to 14 carbon atoms. For reasons of self-aggregation ability, the carbon number of the alkyl group is preferably from 6 to 13, more preferably from 8 to 10.

[Chemical Formula 5]

(5)

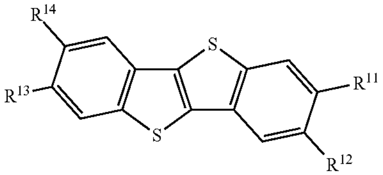

In Formula (5), each of $R^{11}$, $R^{12}$, $R^{13}$ and $R^{14}$ is independently a hydrogen atom or an alkyl group having 1 to 14 carbon atoms. The alkyl group may comprise a heteroatom (typically selected from an oxygen atom and a sulfur atom), and the hydrogen atom in the alkyl group may be substituted with a substituent, such as a halogen atom. For reasons of self-aggregation ability, $R^{11}$=$R^{13}$ is preferred, and $R^{12}$=$R^{14}$ is preferred. From the viewpoint of solubility, preferably, $R^{12}$ and $R^{13}$ are hydrogen atoms, and $R^{12}$ and $R^{14}$ are each independently an alkyl group having 1 to 14 carbon atoms, or $R^{12}$ and $R^{14}$ are hydrogen atoms, and $R^{11}$ and $R^{13}$ are each independently an alkyl group having 1 to 14 carbon atoms. More preferably, $R^{12}$ and $R^{14}$ are hydrogen atoms, and $R^{11}$ and $R^{13}$ are each independently an alkyl group having 1 to 14 carbon atoms. For reasons of self-aggregation ability, the number of carbon atoms of the alkyl group is preferably from 5 to 12, more preferably from 8 to 10.

[Chemical Formula 6]

(6)

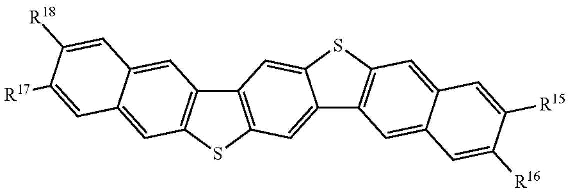

In formula (6), $R^{15}$, $R^{16}$, $R^{17}$ and $R^{18}$ are each independently a hydrogen atom or an alkyl group having 1 to 14 carbon atoms. The alkyl group may comprise a heteroatom (typically selected from an oxygen atom and a sulfur atom), and the hydrogen atom in the alkyl group may be substituted with a substituent, such as a halogen atom. For reasons of self-aggregation ability, $R^{15}$=$R^{17}$ is preferred, and $R^{16}$=$R^{18}$ is preferred. From the viewpoint of solubility, preferably, $R^{16}$ and $R^{18}$ are hydrogen atoms, and $R^{15}$ and $R^{17}$ are each independently an alkyl group having 1 to 14 carbon atoms, or $R^{15}$ and $R^{17}$ are hydrogen atoms, and $R^{16}$ and $R^{18}$ are each independently an alkyl group having 1 to 14 carbon atoms. More preferably, $R^{16}$ and $R^{18}$ are hydrogen atoms, and $R^{15}$ and $R^{17}$ are each independently an alkyl group having 1 to 14 carbon atoms. For reasons of self-aggregation ability, the number of carbon atoms of the alkyl group is preferably from 5 to 12, more preferably from 8 to 10.

Yet another examples of the organic semiconductor constituting the organic semiconductor single crystal film are shown in the following formulas (7) to (15). In Formula (7) to Formula (15), R may be linear alkyl, branched alkyl, fluorinated linear/branched alkyl, triisopropylsilylethynyl, phenyl, or the like.

[Chemical Formula 7]

(7)

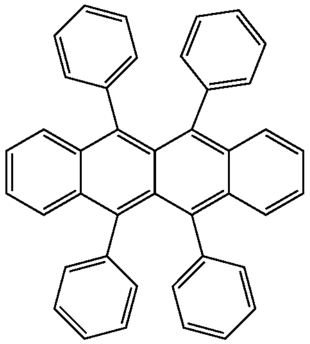

[Chemical Formula 8]

(8)

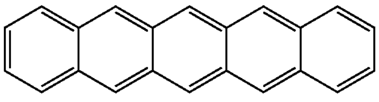

-continued

[Chemical Formula 9]

(9)

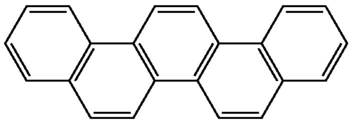

[Chemical Formula 10]

(10)

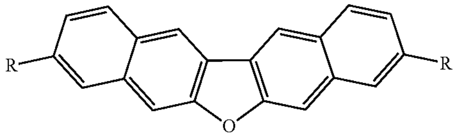

[Chemical Formula 11]

(11)

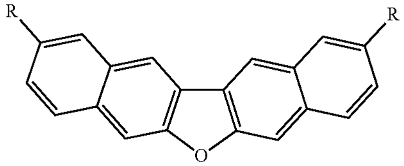

[Chemical Formula 12]

(12)

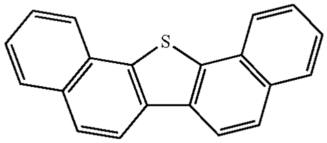

[Chemical Formula 13]

(13)

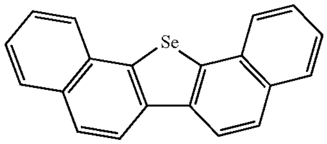

[Chemical Formula 14]

(14)

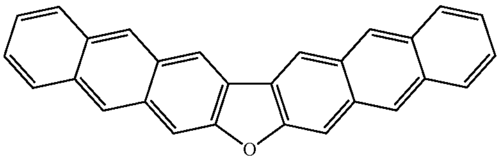

[Chemical Formula 15]

(15)

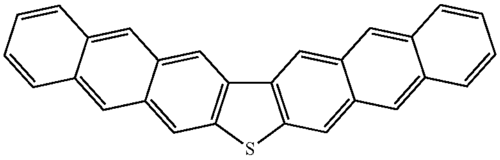

Yet another examples of the organic semiconductor are shown in the following formulas (16) to (19). The n-type organic semiconductors of NDI, PDI, BTDI, and BQQDI shown in Formula (16) to Formula (19) have a laminate structure in which the long axis directions of the main chain are aligned, but are twisted for each molecular layer. R may be linear alkyl, branched alkyl, fluorinated linear/branched alkyl, triisopropylsilylethynyl, phenyl, or the like.

[Chemical Formula 16]

(16)

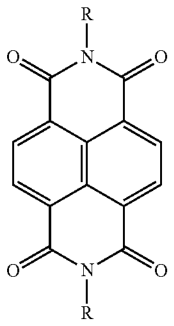

[Chemical Formula 17]

(17)

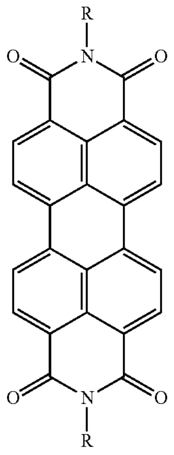

[Chemical Formula 18]

(18)

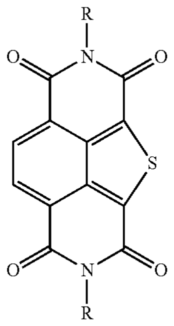

-continued

[Chemical Formula 19]

(19)

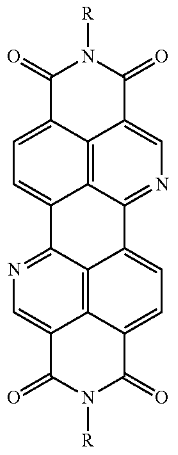

Other examples of the side chain are shown in Formula (20) to Formula (26). In Formulas (20) to (26), the main chain is BQQDI which is an n-type organic semiconductor, but the main chain may be other than BQQDI, for example, NDI, PDI, or the like, and may be the main chain described in Formulas (7) to (15). Formula (20) is an example wherein the side chain is a phenylethyl group, Formula (21) is an example wherein the side chain is an aliphatic alkyl group, Formula (22) is an example wherein the side chain is an aliphatic cyclic alkyl group, Formula (23) is an example wherein the side chain is an aliphatic chain+cyclic alkyl group, Formula (24) is an example wherein the side chain is an aromatic group, Formula (25) is an example wherein the side chain is an alkyl+aromatic (+halogen) group, and the Formula (26) is an example wherein the side chain is an alkyl+halogen group and a functional group is also added to the BQQDI core.

[Chemical Formula 20]

(20)

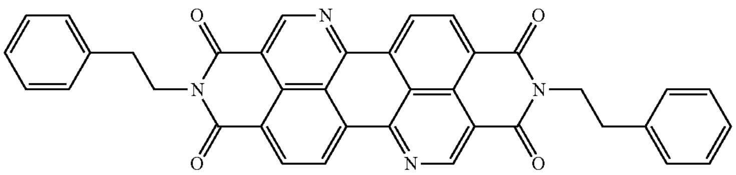

-continued
[Chemical Formula 21]
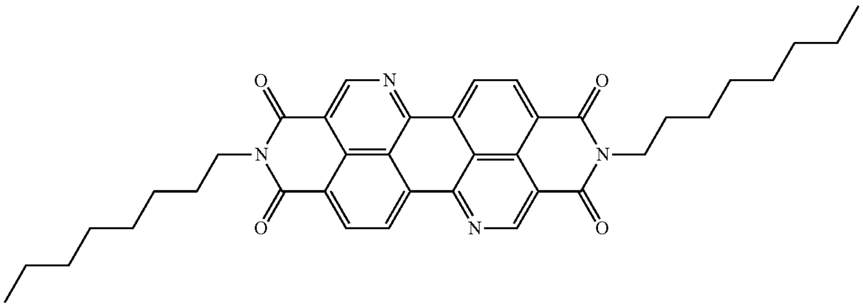
(21)
[Chemical Formula 22]
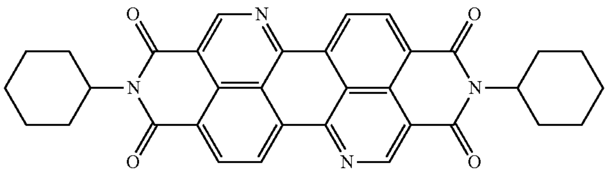
(22)
[Chemical Formula 23]
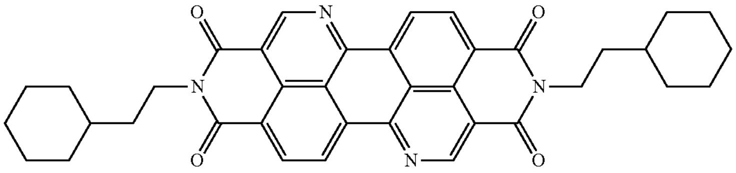
(23)
[Chemical Formula 24]
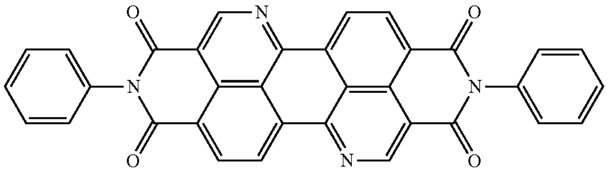
(24)
[Chemical Formula 25]
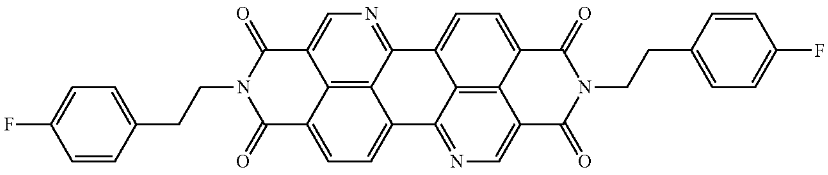
(25)
[Chemical Formula 26]
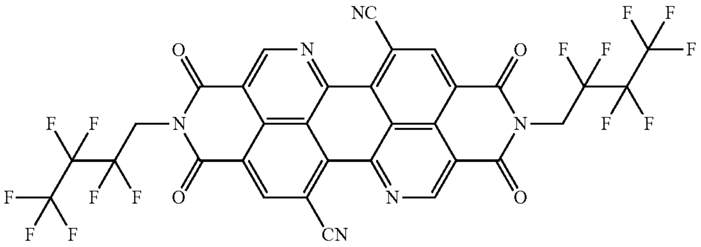
(26)

The organic semiconductor single crystal film can be observed with a transmission electron microscope (TEM) to confirm whether it is single crystal or not.

When the organic film is an organic semiconductor polymer film, the average film thickness of the organic semiconductor polymer film is 1 nm to 1 μm, preferably 3 to 200 nm. By having the average film thickness of the organic semiconductor polymer film in the range, good device characteristics can be obtained. The average film thickness of the organic semiconductor polymer film can be measured using a stylus type surface profile measuring instrument or an atomic force microscope.

The organic semiconductor polymer film exhibits mobility of preferably 0.005 $cm^2/V \cdot s$ or more, more preferably 0.05 $cm^2/V \cdot s$ or more, even more preferably 0.5 $cm^2/V \cdot s$ or more, even more preferably 5 $cm^2/V \cdot s$ or more, and even more preferably 10 $cm^2/V \cdot s$ or more. The mobility of the organic semiconductor polymer film can be calculated from the measurement results of the organic field effect transistor.

If the organic semiconductor polymer film is to be a p-type semiconductor, it is prepared by dissolving a p-type polymer semiconductor in a solvent, and if the organic semiconductor film is to be an n-type semiconductor, it is prepared by dissolving an n-type polymer semiconductor in a solvent. As the p-type polymer semiconductor, a semiconductor obtained by polymerizing or copolymerizing thiophene, thiadiazole, diketopyrrolopyrrole, or the like can be used. As the n-type polymer semiconductor, a semiconductor obtained by polymerizing or copolymerizing naphthalene diimide, perylene diimide, thiophene, or the like can be used. As the solvent, dichlorobenzene, toluene, acetonitrile, butyl acetate, fluoroalcohol, or the like can be used.

The present disclosure is also directed to an apparatus for producing a patterned organic film, comprising: a stamp disposing part configured to dispose a stamp having a convex portion and a concave portion, a first substrate disposing part configured to dispose a hydrophilic and non-water-soluble first substrate having an organic film on a surface of the first substrate, a second substrate disposing part configured to dispose a second substrate, a first driving part configured to move at least one of the first substrate and the stamp so as to press the organic film on the first substrate against the convex portion of the stamp to dispose the organic film on the convex portion and to separate the first substrate from the organic film disposed on the convex portion, a first control part configured to control a force of pressing the organic film on the first substrate against the convex portion of the stamp, a supply part of water or an aqueous solution configured to supply the water or aqueous solution to an interface between the organic film and the first substrate, a second driving part configured to move at least one of the stamp and the second substrate so as to press the organic film disposed on the convex portion of the stamp against the second substrate to dispose the patterned organic film on the second substrate and to separate the stamp from the patterned organic film disposed on the second substrate, and a second control part configured to control a force of pressing the organic film disposed on the convex portion of the stamp against the second substrate.

Figure 28:
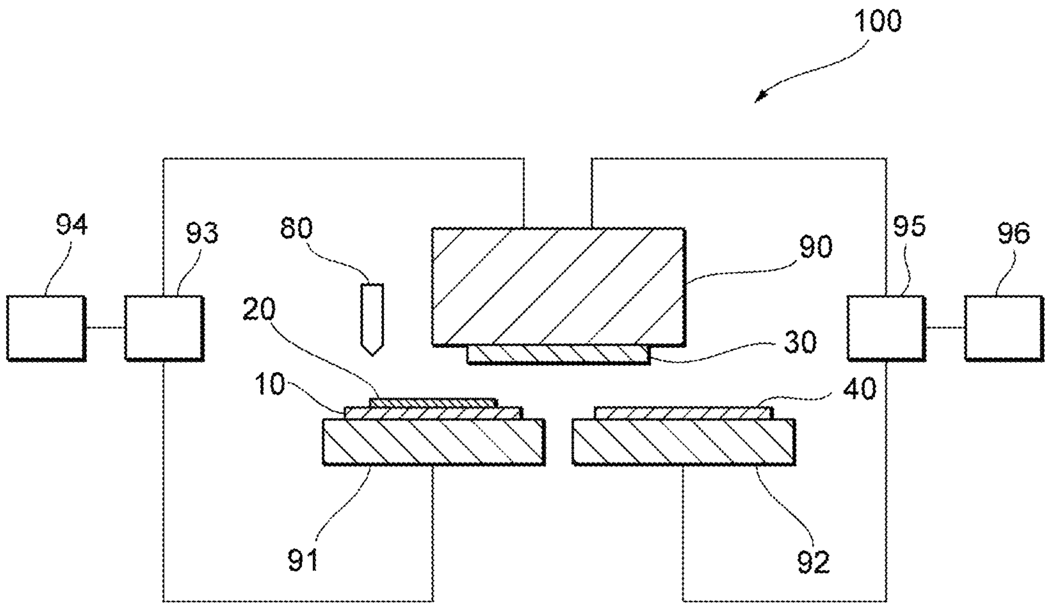
FIG. 28 is a cross-sectional schematic drawing showing a case in which the stamp, the first substrate and the organic film disposed thereon, and the second substrate are disposed in the production apparatus of the present disclosure.

FIG. 28 shows a cross-sectional schematic drawing in which the stamp 30, the first substrate 10 and the organic film 20 disposed thereon, and the second substrate 40 are disposed in the production apparatus 100 of the present disclosure. The stamp 30 is disposed in the stamp disposing part 90, the first substrate 10 is disposed in the first substrate disposing part 91, and the second substrate 40 is disposed in the second substrate disposing part 92. The first substrate disposing part 91 and the second substrate disposing part 92 may be separate or integral. The first substrate disposing part 91 may be integral with the production apparatus 100 or may be separated from the production apparatus 100. The second substrate disposing part 92 may be integral with the production apparatus 100 or may be separated from the production apparatus 100.

The production apparatus 100 comprises a first driving part 93. The first driving part 93 is configured to be able to move at least one of the first substrate 10 and the stamp 30 so as to press the organic film 20 on the first substrate 10 against the convex portion of the stamp 30 to dispose the organic film 20 on the convex portion and to separate the first substrate 10 from the organic film disposed on the convex portion. FIG. 28 is an example in which the first driving part 93 is capable of moving both the first substrate 10 and the stamp 30.

The production apparatus 100 comprises a first control part 94 configured so that the first driving part 93 controls the force with which the organic film 20 on the first substrate 10 is pressed against the convex portion of the stamp 30.

The production apparatus 100 comprises a water or aqueous solution supply part 80 configured to supply water or an aqueous solution to the interface between the organic film 20 and the first substrate 10.

The production apparatus 100 comprises a second driving part 95. The second driving part 95 is configured to move at least one of the stamp 30 and the second substrate 40 so that the organic film on the convex portion of the stamp 30 is pressed against the second substrate 40 to dispose the patterned organic film on the second substrate 40, and the stamp is separated from the patterned organic film disposed on the second substrate 40. FIG. 28 is an example in which the second driving part 95 can move both the stamp 30 and the second substrate 40.

The production apparatus 100 comprises a second control part 96 in which the second driving part 95 is configured to control the force with which the organic film on the convex portion of the stamp 30 is pressed against the second substrate 40.

At least one of the stamp disposing part 90, and the first substrate disposing part 91 and the second substrate disposing part 92 is movable in a direction perpendicular to the pressing direction. At least one of the first driving part 93 and the second driving part 95 may be a driving part that moves at least one of the stamp disposing part 90, and the first substrate disposing part 91 and the second substrate disposing part 92, or the production apparatus 100 may comprise a driving part that moves at least one of the stamp disposing part 90, and the first substrate disposing part 91 and the second substrate disposing part 92 separately from the first driving part 93 and the second driving part 95. The first driving part 93 and the second driving part 95 may be integral with each other or may be separate from each other. The first control part 94 and the second control part 96 may be integral with or separate from each other.

Preferably, the first control part is configured to control a distribution of the force of pressing the organic film in a plane of the organic film when the organic film on the first substrate is pressed against the convex portion. Preferably, the second control part is configured to control a distribution of the force of pressing the organic film in a plane of the organic film when the organic film disposed on the convex portion of the stamp is pressed against the second substrate.

Preferably, the production apparatus 100 comprises a water or aqueous solution amount adjusting part configured to be able to adjust the amount of the water or aqueous solution supplied by the water or aqueous solution supply part. The water or aqueous solution amount adjusting part may automatically adjust the valve opening degree in accordance with the flow rate set value.

Preferably, the production apparatus 100 comprises a supply position adjustment part that can recognize a position of the interface between the organic film and the first substrate for supplying the water or aqueous solution, and can adjust a position of the water or aqueous solution supplied by the water or aqueous solution supply part. The position of the interface between the organic film and the first substrate may be recognized by image processing, such as binarization processing by a camera.

Preferably, the production apparatus 100 comprises a first alignment part that controls a position at which the organic film on the first substrate is pressed against the convex portion of the stamp. The alignment in the first alignment part can be an alignment based on an edge of the first substrate or an edge of the organic film and an edge of the stamp, an alignment based on a marking on the first substrate or the organic film and a marking on the stamp, a combination thereof, or the like. The detection of the reference position can be detection by image processing such as binarization, mechanical contact detection, or the like.

Preferably, the production apparatus 100 comprises a second alignment part that controls a position at which the organic film on the convex portion of the stamp is pressed against the second substrate. The alignment in the second alignment part can be an alignment based on an edge of the stamp or an edge of the organic film and an edge of the second substrate, an alignment based on a marking on the stamp or the organic film and a marking on the second substrate, a combination thereof, or the like. The detection of the reference position can be detection by image processing such as binarization, mechanical contact detection, or the like. The first alignment part and the second alignment part may be common. The first alignment part and the second alignment part may have a configuration of an alignment apparatus conventionally used, such as a camera, a processing part, a storage part, a communication part capable of transmitting and receiving data, or the like.

Figure 39:
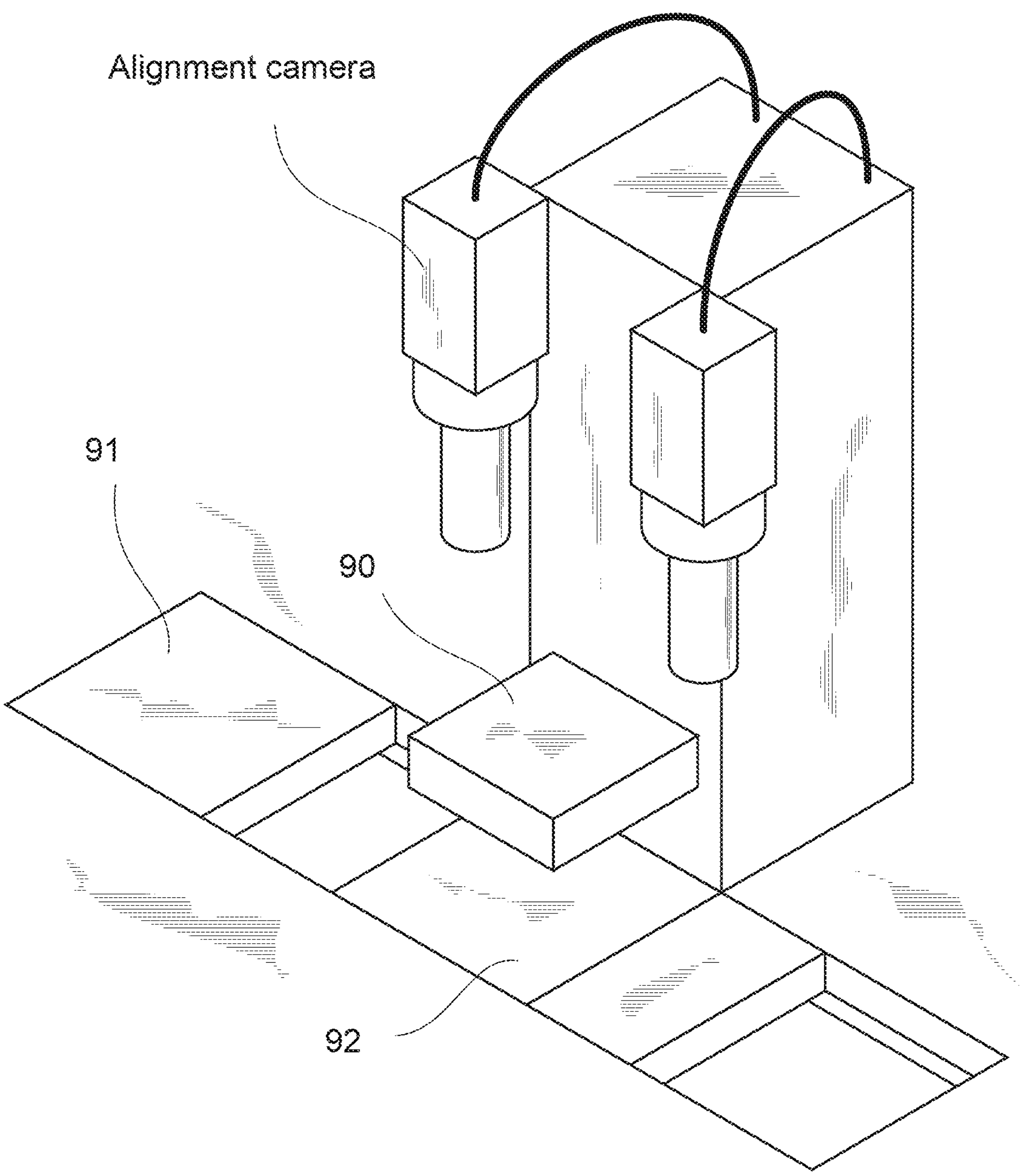
FIG. 39 is an external photograph of an example of the production apparatus of the present disclosure.

FIG. 39 shows an external photograph of an example of the production apparatus of the present disclosure. The production apparatus comprises the stamp disposing part 90, the first substrate disposing part 91, the second substrate disposing part 92, and an alignment camera. The four alignment cameras included in the production apparatus of FIG. 39 function as cameras of the first alignment part and the second alignment part.

With respect to the configuration of the organic film in the production apparatus of the present disclosure, the contents relating to the organic film in the method for producing the patterned organic film described above can be applied. With respect to the configurations of the stamp, the first substrate, and the second substrate in the production apparatus of the present disclosure, the contents relating to the stamp, the first substrate, and the second substrate in the method for producing the patterned organic film described above can be applied, respectively.

The present disclosure is also directed to an organic semiconductor device comprising: a substrate, and a patterned organic film on the substrate, wherein the organic film is hydrophobic, and at least one of the organic film and the substrate is an organic semiconductor.

The substrate in the organic semiconductor device is preferably free of damage accompanying the patterning of the organic film.

Figure 24:
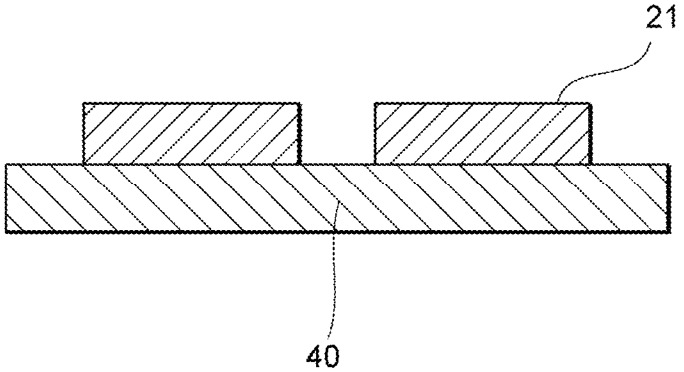
FIG. 24 is a cross-sectional schematic drawing of the organic semiconductor device of the present disclosure.

FIG. 24 shows a cross-sectional schematic drawing of the substrate 40 and the organic film 21 patterned on the substrate included in the organic semiconductor device of the present disclosure. By using the substrate and the patterned organic film on the substrate included in the organic semiconductor device of the present disclosure, a field-effect transistor, for example, a bottom gate/top contact type field-effect transistor illustrated in FIG. 12 and FIG. 17 can be produced.

The free of damage accompanying the patterning of the organic film means that there is no damage associated with the patterning of the organic film on the substrate conventionally performed. In the conventional technique, when patterning an organic film is to be performed, patterning is performed on a substrate, but the substrate surface can be altered or decomposed by plasma treatment, laser etching, etching solvent treatment, or the like when etching the organic film. On the other hand, in the organic semiconductor device of the present disclosure, as described in the method for producing the patterned organic film, since the patterned organic film is transferred onto the substrate, the substrate in the organic semiconductor device of the present disclosure is substantially free from alteration or decomposition accompanying the patterning of the organic film.

The substantially free from alteration or decomposition includes that the substrate is not substantially dissolved or swollen by a photoresist, a developer, an etchant, a stripper, or the like used in a photolithography process of an organic film in the conventional technique, that the substrate surface is not altered or decomposed by plasma treatment during an etching of an organic film in the conventional technique, that the substrate is not expanded or contracted by heat treatment, or the like, of an organic film in a photolithography process in the conventional technique, and the like. Preferably, the patterned organic film is also free from damage associated with the patterning of the organic film. That is, preferably, also with respect to the patterned organic film, the above-described alteration or decomposition accompanying the patterning of the organic film does not substantially occur.

Figure 25:
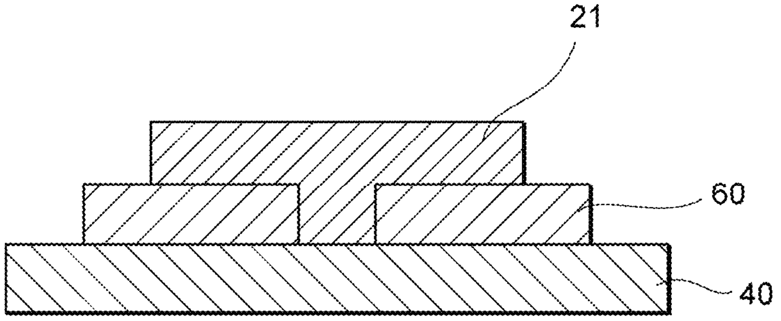
FIG. 25 is a cross-sectional schematic drawing of the organic semiconductor device having electrodes between the substrate and the organic film.
Figure 27:
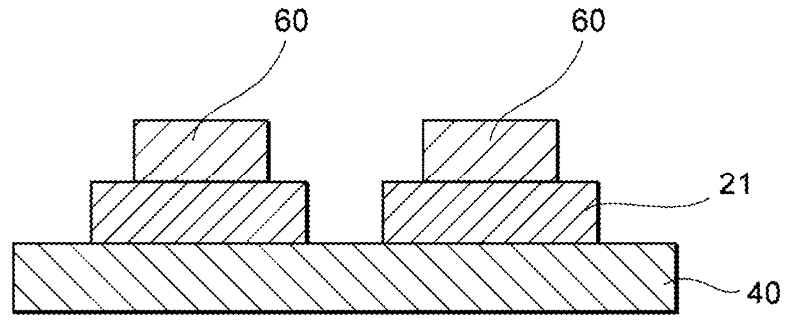
FIG. 27 is a cross-sectional schematic drawing of the organic semiconductor device having electrodes on a surface of the organic film opposite the substrate.
Figure 29:
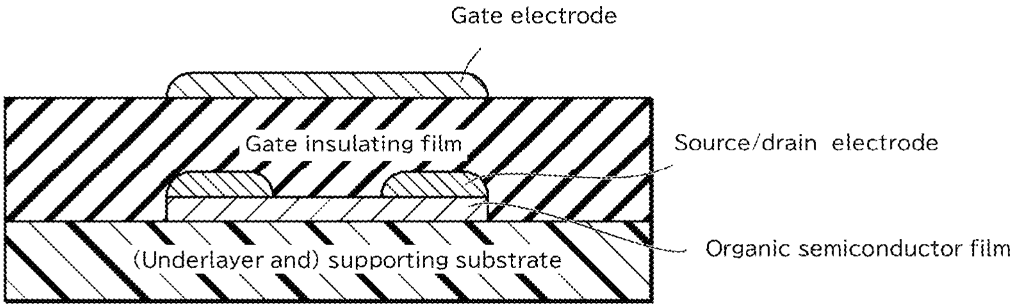
FIG. 29 is a cross-sectional schematic drawing of a top gate/top contact structure.
Figure 30:
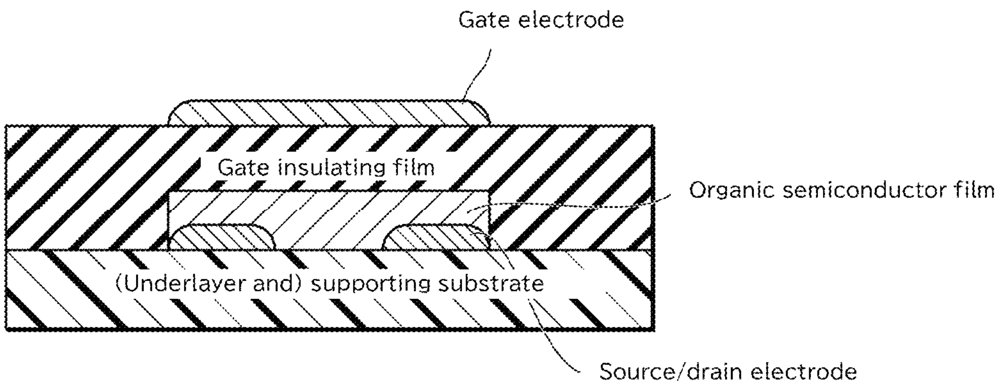
FIG. 30 is a cross-sectional schematic drawing of a top gate/bottom contact structure.
Figure 31:
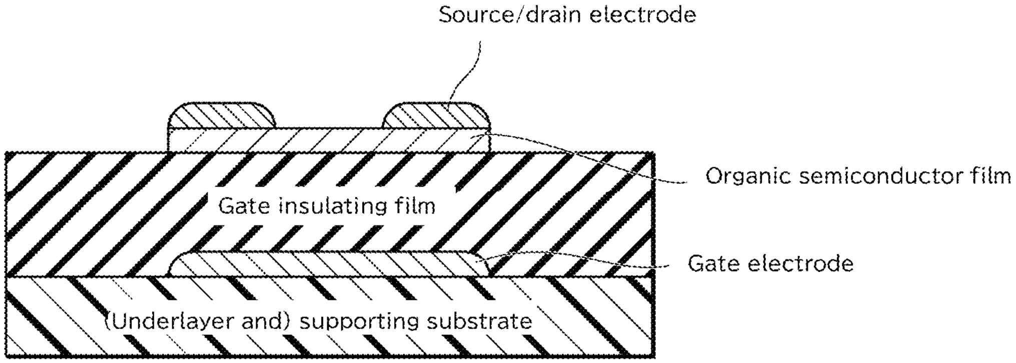
FIG. 31 is a cross-sectional schematic drawing of a bottom gate/top contact structure.
Figure 32:
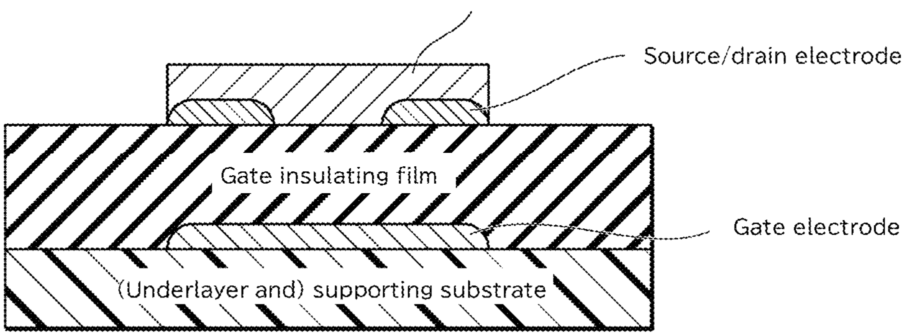
FIG. 32 is a cross-sectional schematic drawing of a bottom gate/bottom contact structure.

The organic semiconductor device of the present disclosure preferably comprises an electrode in at least a part between the substrate and the organic film, at least a part of the side of the organic film opposite to the substrate, or both. FIG. 25 shows a cross-sectional schematic drawing of the organic semiconductor device having the electrodes 60 between the substrate 40 and the organic film 21. FIG. 27 shows a cross-sectional schematic drawing of the organic semiconductor device having the electrodes 60 on the side of the organic film 21 opposite to the substrate 40. The thickness of the electrode is preferably 10 to 50 nm. FIGS. 29 to 32 show representative transistor structures that can be taken by the organic semiconductor device of the present disclosure. FIG. 29 is a cross-sectional schematic drawing of a top gate/top contact structure. FIG. 30 is a cross-sectional schematic drawing of a top gate/bottom contact structure. FIG. 31 is a cross-sectional schematic drawing of a bottom gate/top contact structure. FIG. 32 is a cross-sectional schematic drawing of a bottom gate/bottom contact structure. The structure that the organic semiconductor device of the present disclosure can take is not limited to the structures shown in FIGS. 29 to 32, and for example, a layer of a sealing film or the like may further exist on the uppermost layer of the structure shown in FIGS. 29 to 32.

Figure 26:
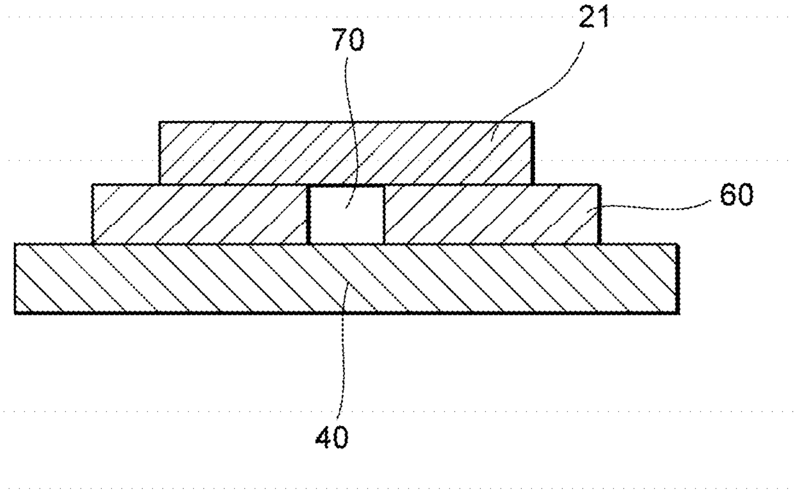
FIG. 26 is a cross-sectional schematic drawing of the organic semiconductor device having a space between the substrate, the organic film, and the electrodes.

The organic semiconductor device of the present disclosure preferably comprises a space between the substrate, the organic film, and the electrode. FIG. 26 shows a cross-sectional schematic drawing of the organic semiconductor device having a space 70 between the substrate 40, the organic film 21, and the electrode 60. By having a bridging structure as shown in FIG. 26, it can function as an insulating layer of a transistor.

The width of the space is preferably 500 nm to 5 μm.

The organic semiconductor device of the present disclosure can be an organic EL (electroluminescence) element, an organic solar cell element, an organic photoelectric conversion element, an organic transistor element, an organic field effect transistor element, an organic complementary semiconductor device (organic CMOS or organic CMOS logic circuit) comprising a p-type organic transistor and an n-type organic transistor, an inorganic organic hybrid complementary semiconductor device comprising an organic transistor and an inorganic transistor, or the like.

With respect to the configuration of the organic film in the organic semiconductor device of the present disclosure, the contents relating to the organic film in the method for producing the patterned organic film described above can be applied. With respect to the configuration of the substrate in the organic semiconductor device of the present disclosure, the contents relating to the second substrate in the method for producing the patterned organic film described above can be applied.

An integrated circuit can be obtained using the organic semiconductor device of the present disclosure. The integrated circuit may include preferably 10 or more transistors, more preferably 100 or more transistors, even more preferably 1000 or more transistors, and even more preferably 10000 or more transistors. The integrated circuit includes logic gates of AND, OR, NOT, NAND, NOR, XOR, and XNOR. An example of the integrated circuit includes a D flip-flop (DFF) circuit which is a type of a sequential circuit that stores past inputs and determines an output.

EXAMPLES

Example 1

(Mold Preparation)

An Eagle glass substrate was subjected to UV/$O_3$ treatment for 10 minutes to perform hydrophilic treatment on the glass substrate. Next, SU-8, which was a photoresist, was spin-coated on the glass substrate subjected to the hydrophilic treatment.

The glass substrate on which SU-8 was spin-coated was subjected to heat treatment at 95° C. for 6 minutes, masked with a predetermined pattern, subjected to UV exposure, and further subjected to heat treatment at 95° C. for 3 minutes. SU-8 was then developed with propylene glycol monomethyl acetate (PGMEA) for 3 minutes, and heat treatment was performed at 170° C. for 30 minutes.

The F-SAM treatment was performed by the vapor phase method for 3.5 hours on the glass substrate subjected to the SU-8 development and the heat treatment to form a self-assembled monolayer, and a glass mold having a photoresist with the self-assembled monolayer on the surface was prepared.

(PDMS Stamp Production)

PDMS (main agent: SIM-360, curing agent: CAT-360, produced by Shin-Etsu Chemical Co., Ltd.) liquid was stirred and defoamed using Awatorirentaro. The stirred and defoamed PDMS liquid was dropped on the prepared mold, the Eagle glass substrate was arranged on the PDMS, a weight was placed on the Eagle glass substrate and allowed to stand, and the PDMS was thermally cured at 150° C. for 30 minutes.

The mold was then peeled off from the PDMS to produce a stamp. The produced stamp had 100 convex portions, the width of the convex portion was 500 μm, the length of the convex portion was 700 μm, the distance between the adjacent convex portions was 500 μm, and the distance between the uppermost portion of the convex portion and the lowest portion of the concave portion was 7 μm.

(Fabrication of Patterned Organic Semiconductor Films)

As the organic semiconductor, a powder of p-type organic semiconductor $C_9$-DNBDT-NW of the following formula (27), which shows high mobility, was prepared.

[Chemical Formula 27]

(27)

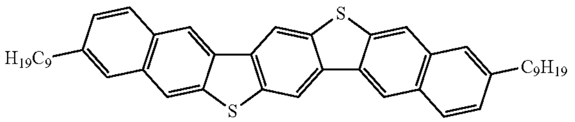

3-chlorothiophene was used as a solvent, and the organic semiconductor powder was dissolved in the solvent to prepare an organic semiconductor solution.

As the first substrate, an Eagle glass substrate (hereinafter also referred to as a glass substrate) whose surfaces were hydrophilic by UV/$O_3$ treatment was prepared. The prepared organic semiconductor solution was coated on the glass substrate heated to 90° C. by the continuous edge casting method, and an organic semiconductor single crystal film having an average thickness of 12 nm, an area of 80 $cm^2$, and an area of a single domain of 1000 $mm^2$ was formed on the glass substrate by the continuous edge casting method. The water contact angle on the surface of the organic semiconductor single crystal film was 108 degrees.

As the second substrate, a parylene/$SiO_2$/n-doped Si substrate in which parylene (diX-SR (registered trademark)) was deposited was prepared.

The patterned organic semiconductor single crystal films were produced using the production apparatus schematically shown in FIG. 28. The stamp was disposed in the stamp disposing part, the first substrate on which the organic semiconductor single crystal film (hereinafter, also referred to as a semiconductor film) was formed was disposed in the first substrate disposing part, and the second substrate was disposed in the second substrate disposing part.

Figure 9:
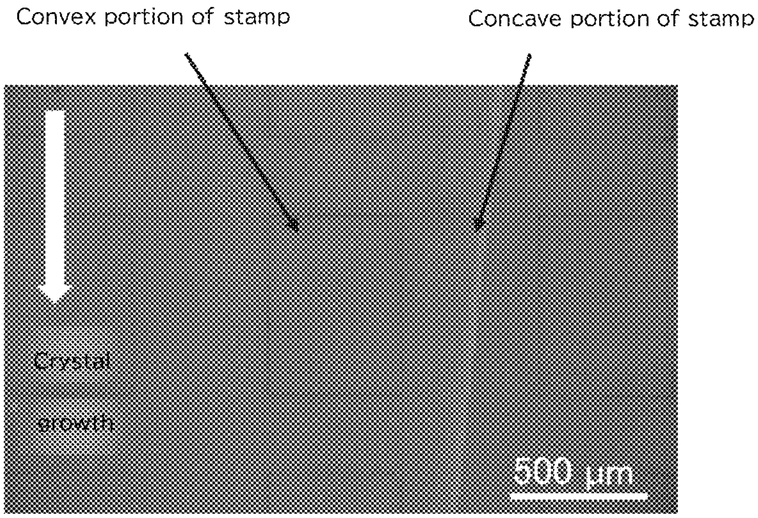
FIG. 9 is a polarized light microscopic image of the semiconductor film transferred on the PDMS stamp.
Figure 10:
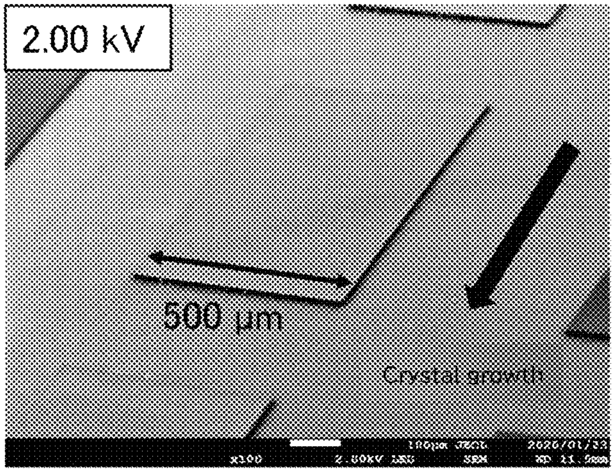
FIG. 10 is a scanning electron microscope (SEM) image of the semiconductor film transferred on the PDMS stamp.

As shown in FIG. 1, the first substrate was pressed against the produced stamp so that the convex portions of the stamp were in contact with the semiconductor film. As shown in FIG. 2, after pressing the first substrate against the stamp with a pressure of 50 kPa per area of the convex portions of the stamp, water was dropped at the interface between the first substrate and the semiconductor film, the semiconductor films were disposed on the convex portions of the stamp, as shown in FIG. 3, and the first substrate was separated from the semiconductor films disposed on the convex portions. FIG. 9 shows a polarized light microscopic image of the semiconductor films transferred on the PDMS stamp. In FIG. 9, the semiconductor films have been transferred onto the convex portions and the concave portions of the PDMS stamp. FIG. 10 shows a scanning electron microscope (SEM) image obtained by observing the semiconductor films transferred on the convex portions and the concave portions of the PDMS stamp from obliquely above.

The patterned semiconductor films were disposed on the second substrate by pressing the stamp against the second substrate with a pressure of 100 kPa per area of the convex portions of the stamp, as shown in FIG. 4, so that the semiconductor films transferred on the convex portions of the stamp were in contact with the parylene on the second substrate, the stamp was separated from the semiconductor films arranged on the second substrate, and patterned organic semiconductor single crystal films 21 schematically shown in FIG. 5 were obtained.

Figure 11:
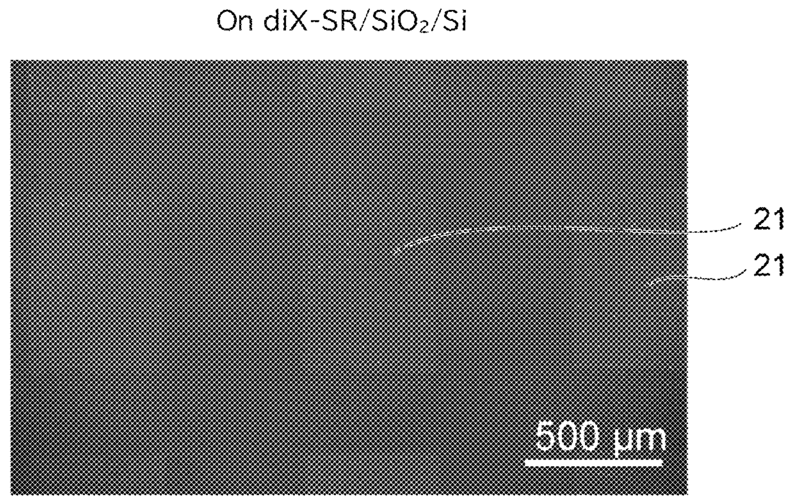
FIG. 11 is a polarized light microscopic image of the patterned organic semiconductor film transferred on the second substrate observed from the top surface.

FIG. 11 shows a polarized light microscopic image obtained by observing the transferred organic semiconductor films 21 from the top surface of the organic semiconductor films 21. The obtained organic semiconductor single crystal films were neatly patterned and formed, and was a 100-piece pattern having a thickness of 8 nm, a width of 500 μm, and spacing between the semiconductor films of 500 μm.

Figure 12:
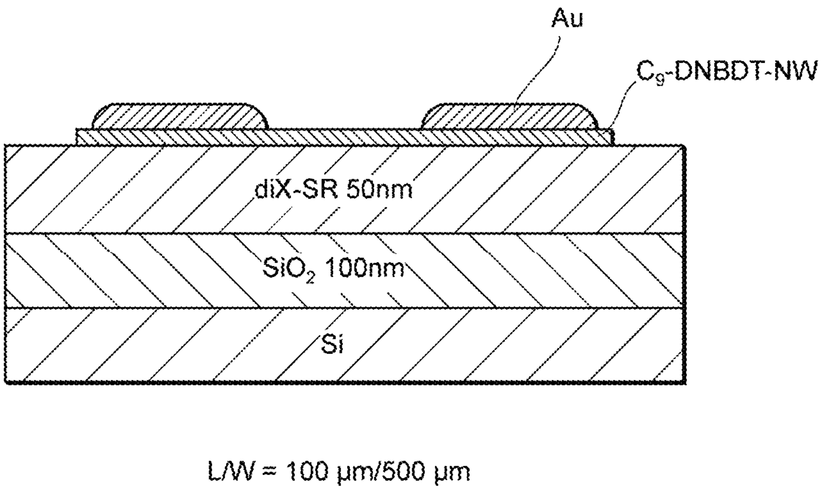
FIG. 12 is a cross-sectional schematic drawing of an organic semiconductor single-crystal film and Au electrodes disposed on a parylene/$SiO_2$/n-doped Si substrate.
Figure 13:
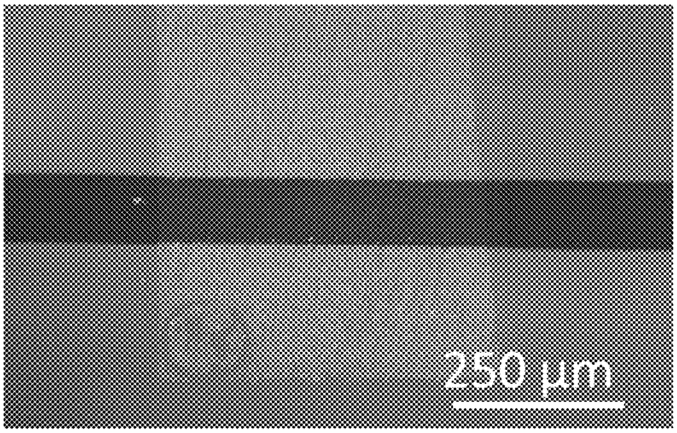
FIG. 13 is a polarized light microscopic image of a produced BGTC type OFET observed from the top surface.

As shown in FIG. 12, Au electrodes having a length of 0.4 mm, a width of 2 mm, and a height of 40 nm were formed as S/D electrodes (source/drain electrodes) on the organic semiconductor single crystal films of the $C_9$-DNBDT-NW disposed on the parylene/$SiO_2$/n-doped Si substrate by vacuum-deposition using metal masks, thereby producing bottom gate top contact (BGTC) type organic field-effect transistors (OFETs). The channel length L was 100 μm, and the channel width W was 500 μm. The channel length is the distance between the two electrodes (S/D electrodes). FIG. 13 shows a polarized light microscopic image observed from the top surface of the produced BGTC type OFET.

Figure 14:
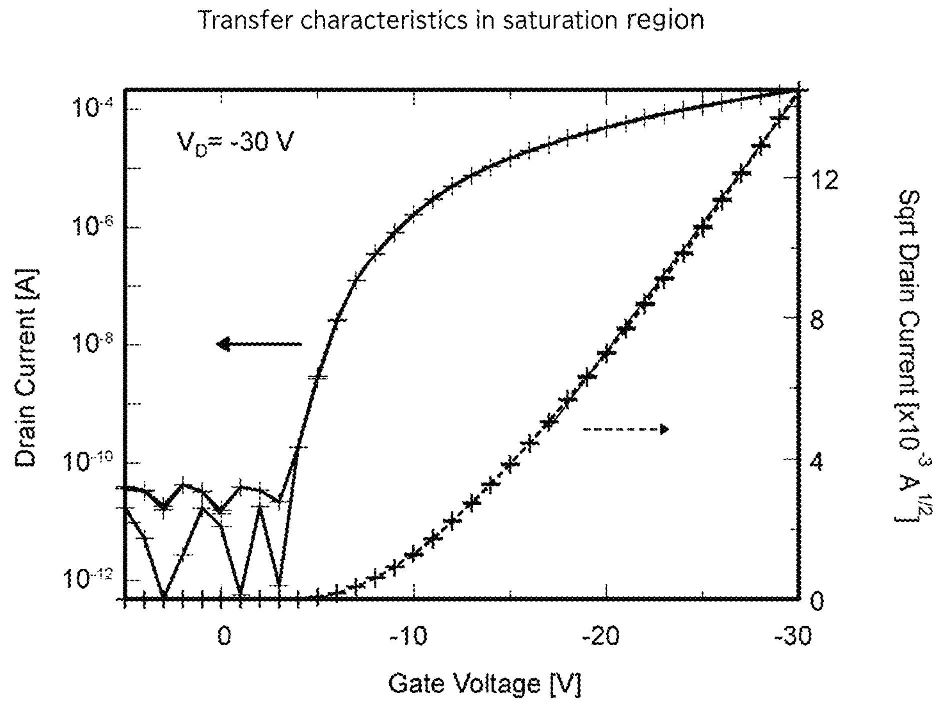
FIG. 14 is a graph of transfer characteristics showing the relationship between gate voltage and drain current in the saturation region.
Figure 15:
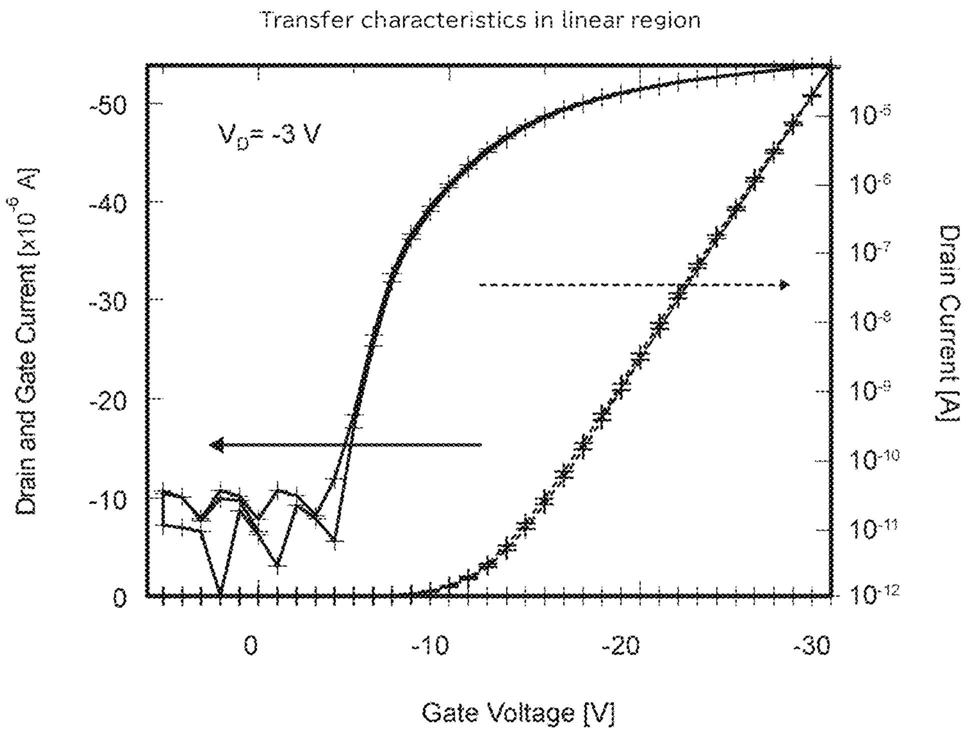
FIG. 15 is a graph of transfer characteristics showing the relationship between gate voltage and drain current in the linear region.
Figure 16:
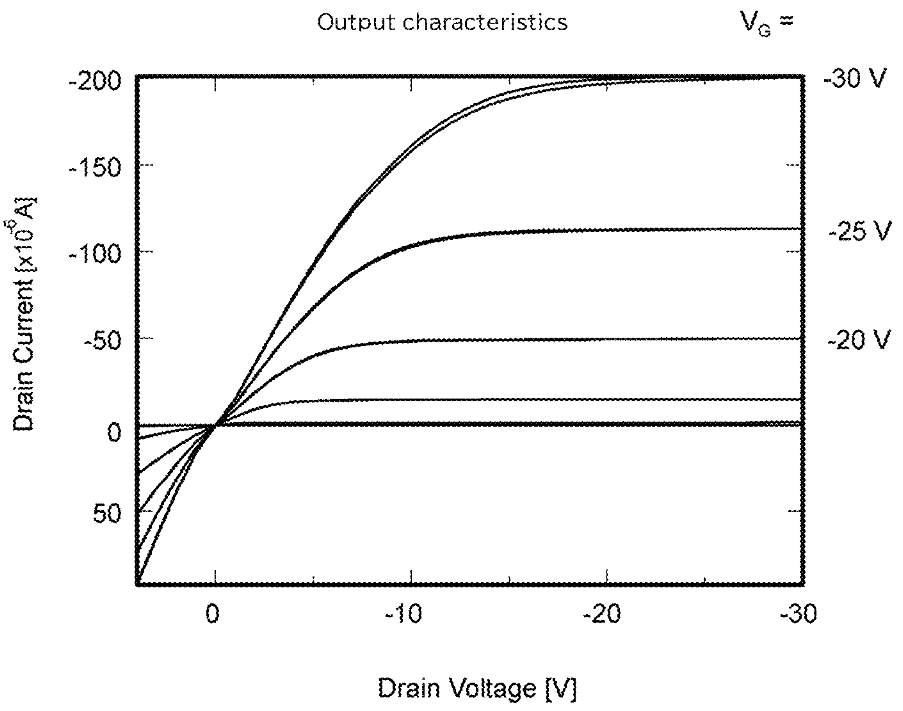
FIG. 16 is a graph of output characteristics showing the relationship between drain voltage and drain current depending on the gate voltage.

FIG. 14 shows a graph of the transfer characteristics representing the relationship between the gate voltage and the drain current in the saturation region of the produced BGTC type OFET. FIG. 15 shows a graph of the transfer characteristics representing the relationship between the gate voltage and the drain current in the linear region. FIG. 16 shows a graph of the output characteristics representing the relationship between the drain voltage and the drain current depending on the gate voltage. The mobility in the saturated region was 10.7 $cm^2$/V·s, and the mobility in the linear region was 9.92 $cm^2$/V·s, which were very large mobility.

Example 2

Patterned organic semiconductor single crystal films were obtained in the same manner as in Example 1 except that a CYTOP (registered trademark)/$SiO_2$/n-doped Si substrate was used instead of the parylene/$SiO_2$/n-doped Si substrate as the second substrate.

The obtained organic semiconductor single crystal films 21 were neatly patterned and formed, and was a 100-piece pattern having a thickness of 8 nm, a width of 500 μm, and spacing between the semiconductor films of 500 μm.

Figure 17:
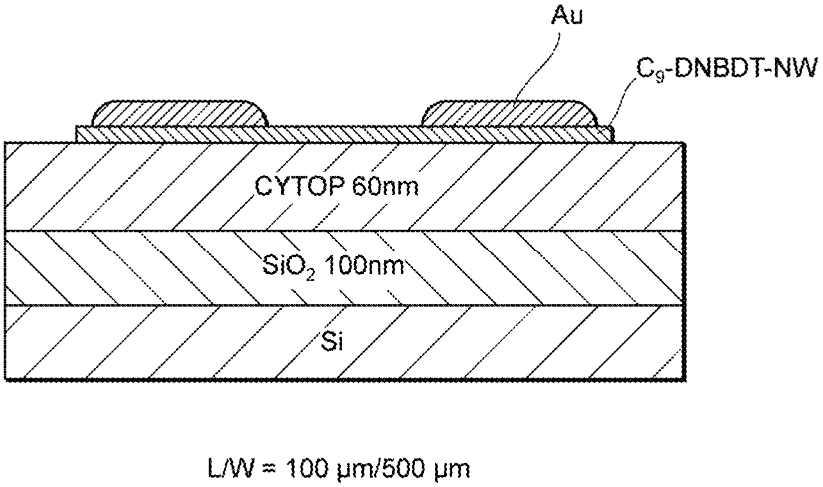
FIG. 17 is a cross-sectional schematic drawing of an organic semiconductor single-crystal film and Au electrodes disposed on a CUTUP (registered trademark)/$SiO_2$/n-doped Si substrate.
Figure 18:
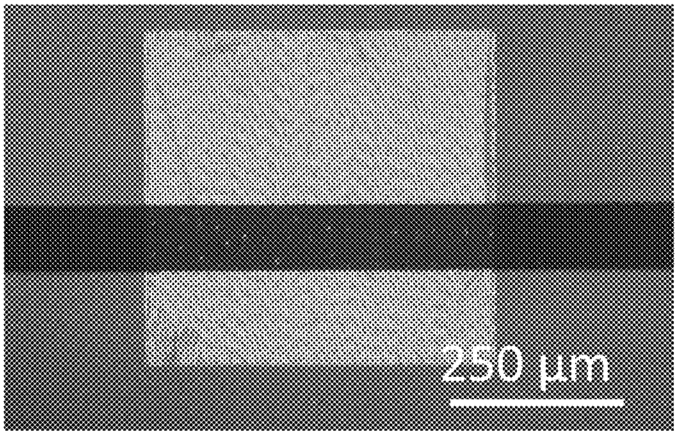
FIG. 18 is a polarized light microscopic image of a produced BGTC type OFET observed from the top surface.

As shown in FIG. 17, Au electrodes having a length of 0.4 mm, a width of 2 mm, and a height of 40 nm were formed as S/D electrodes (source/drain electrodes) on the organic semiconductor single crystal films of the $C_9$-DNBDT-NW disposed on the CYTOP (registered trademark)/$SiO_2$/n-doped Si substrate by vacuum-deposition using metal masks, thereby producing bottom gate top contact (BGTC) type organic field-effect transistors (OFET). The channel length L was 100 μm, and the channel width W was 500 μm. FIG. 18 shows a polarized light microscopic image observed from the top surface of the produced BGTC type OFET.

Figure 19:
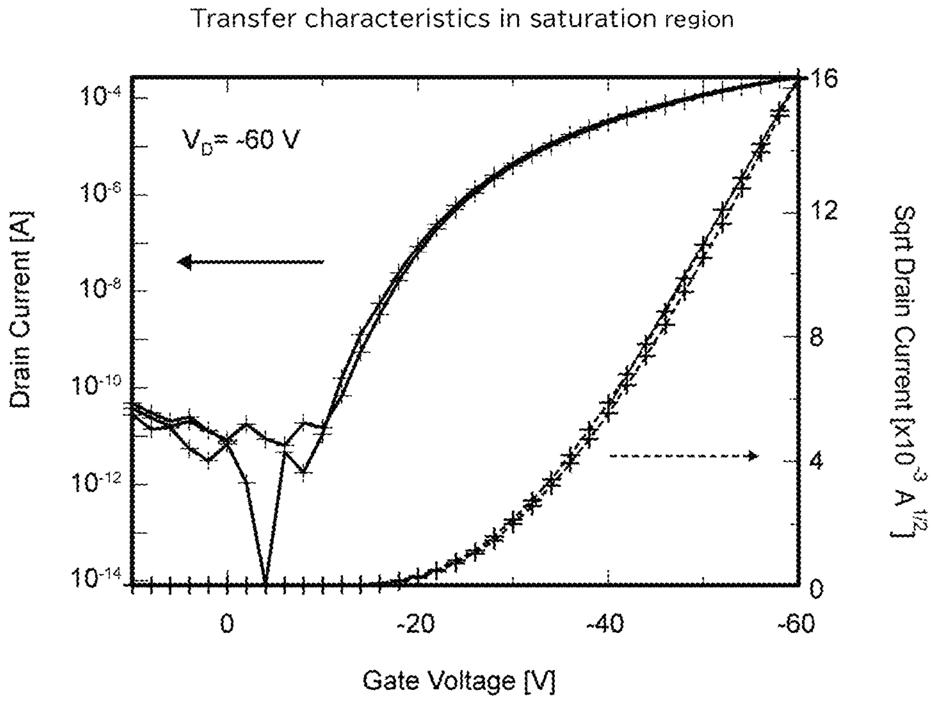
FIG. 19 is a graph of transfer characteristics showing the relationship between gate voltage and drain current in the saturation region.
Figure 20:
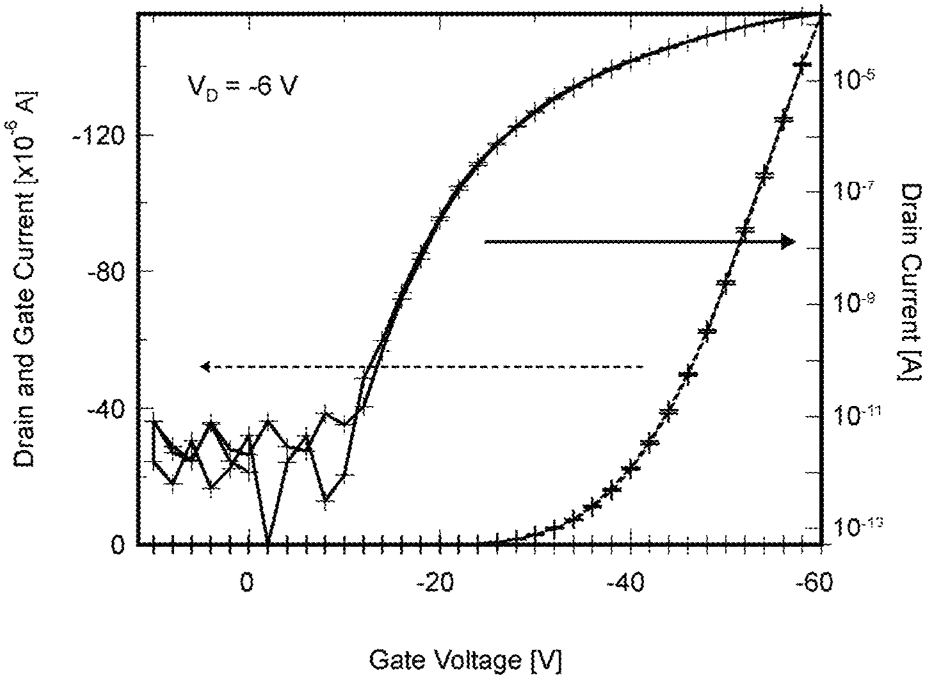
FIG. 20 is a graph of transfer characteristics showing the relationship between gate voltage and drain current in the linear region.
Figure 21:
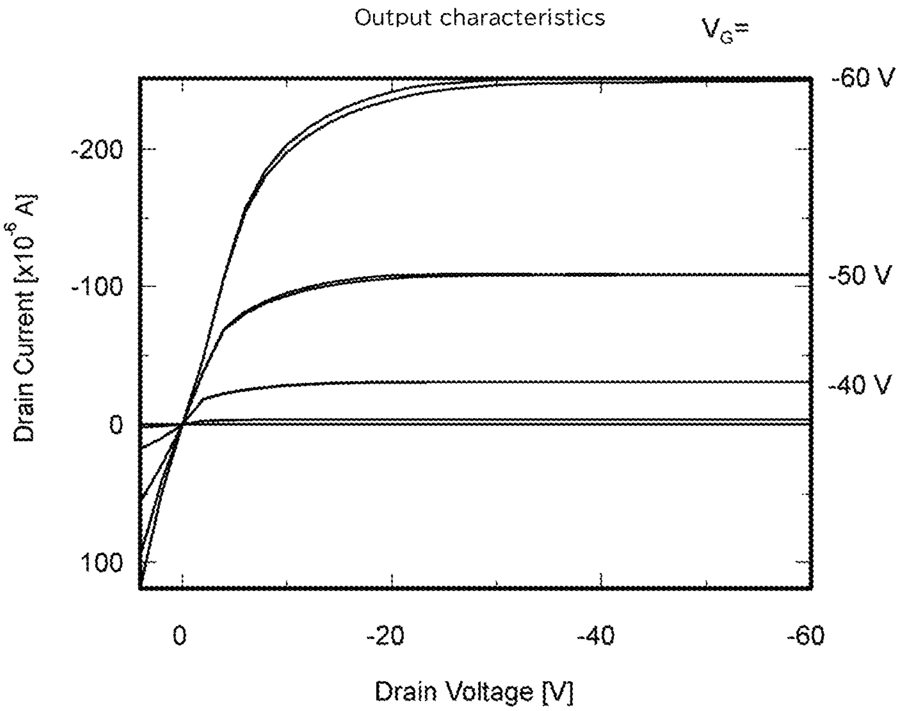
FIG. 21 is a graph of output characteristics showing the relationship between drain voltage and drain current depending on the gate voltage.

FIG. 19 shows a graph of the transfer characteristics representing the relationship between the gate voltage and the drain current in the saturation region of the produced BGTC type OFET. FIG. 20 shows a graph of the transfer characteristics representing the relationship between the gate voltage and the drain current in the linear region. FIG. 21 shows a graph of the output characteristics representing the relationship between the drain voltage and the drain current depending on the gate voltage. The mobility in the saturated region was 7.18 $cm^2$/V·s, and the mobility in the linear region was 16.8 $cm^2$/V·s, which were very large mobility.

Example 3

Patterned organic semiconductor single crystal films were obtained in the same manner as in Example 1 except that a trimethoxy(2-phenylethyl)silane (β-PTS)/$SiO_2$/n-doped Si substrate was used instead of the parylene/$SiO_2$/n-doped Si substrate as the second substrate and a stamp having widths of 20 μm, 40 μm, 50 μm, 100 μm, and 150 μm of the convex portions was used.

FIG. 22 shows a polarized light microscopic image obtained by observing the organic semiconductor single crystal films 21 transferred on the second substrate from the top surface of the organic semiconductor single crystal films 21. The obtained organic semiconductor single crystal films were neatly patterned and formed, and had a thickness of 8 nm, widths of 15 μm, 35 μm, 45 μm, 95 μm, and 145 μm, a length of 800 μm, and spacing between the semiconductor films of 100 μm.

Example 4

Patterned organic semiconductor single crystal film were obtained in the same manner as in Example 1 except that a β-PTS/$SiO_2$/n-doped Si substrate was used instead of the parylene/$SiO_2$/n-doped Si substrate as the second substrate and a stamp having spacing of 5 μm, 10 μm, 20 μm, and 30 μm between the convex portions was used.

FIG. 23 shows a polarized light microscopic image obtained by observing the organic semiconductor single crystal films 21 transferred on the second substrate from the top surface of the organic semiconductor single crystal films 21. The obtained organic semiconductor single crystal films were neatly patterned and formed, and were in a pattern having a thickness of 8 nm, a width of 200 μm, a length of 800 μm, and spacing between the semiconductor films of 10 μm, 15 μm, 25 μm, and 35 μm.

Example 5

Patterned organic semiconductor single crystal films were obtained in the same manner as in Example 1 except that a parylene/$SiO_2$/n-doped Si substrate having diameters of 4 inches was used as the second substrate and 4700 patterned organic semiconductor single crystal films having thicknesses of 4 to 20 nm, widths of 50 to 9000 μm, lengths of 10 to 1300 μm, and spacing between the semiconductor films of 2 to 10000 μm were formed. FIG. 33 shows an external photograph of the 4-inch wafer having the obtained patterned semiconductor organic films.

Example 6

Patterned organic semiconductor single crystal films were obtained in the same manner as in Example 1 except that an Si substrate was used as the second substrate and 64 organic semiconductor single crystal films of 700 μm×500 μm patterned as an 8×8 array at spacing of 500 μm in the lateral direction and 300 μm in the longitudinal direction were formed on the Si substrate.

FIG. 34 shows a laser confocal microscopic image of the obtained organic semiconductor single crystal film array arranged at 8×8. The portion surrounded by the square frame is one organic semiconductor single crystal film of 700 μm×500 μm, and the organic semiconductor single crystal films are aligned with 8×8 in the entire microscopic image.

Figure 36:
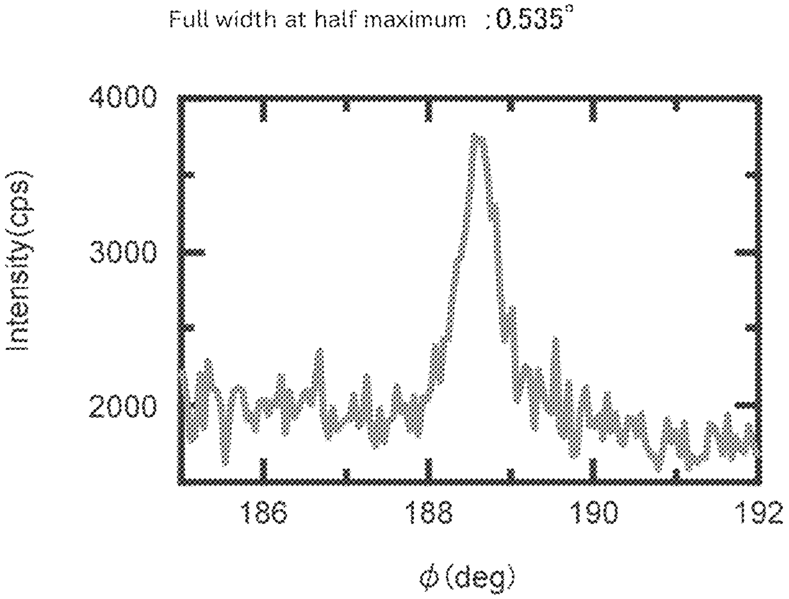
FIG. 36 is an enlarged drawing of a 020 diffractive line of the $C_9$-DNBDT-NW organic semiconductor single crystal surrounded by a broken line portion of FIG. 35.

FIG. 35 shows the measurement results of in-plane X-ray diffraction (SmartLab, Rigaku Corporation, source CuKα (wavelength λ=1.54056 Å)) measured by irradiating X-rays to the portion surrounded by the broken line portion of FIG. 34 while rotating the substrate holding the organic semiconductor single crystal film by 360 degrees. One diffractive peak was observed in the period of 180 degrees, and it was found that the organic semiconductor single crystal films in the broken line portion were all single crystal films oriented substantially in the same direction. It was suggested that the crystal orientations of the organic semiconductor single crystal films located in the portion surrounded by the broken line portion of FIG. 34 were included within ±1 degree. FIG. 36 shows an enlarged drawing of the 020-diffractive line of the $C_9$-DNBDT-NW organic semiconductor single crystal surrounded by the broken line portion of FIG. 35. The half width of the peak in FIG. 36 was calculated to be 0.535 degrees, and a very sharp peak was obtained.

Example 7

(Fabrication of n-Type TFT)

As the substrate, a polyethylene naphthalate (poly(ethylene 2,6-naphthalate):PEN) substrate (Teonex Q65HA, Teijin Dupont Film Corporation) having a thickness of 125 μm was used. After the protective film was peeled off from the PEN substrate, the substrate was heated on a hot plate at 150° C. as a pretreatment for 3 hours, and ultrasonic cleaning was performed with acetone and 2-propanol for 10 minutes each.

An Al film having a thickness of 30 nm was formed on the entire surface of the PEN substrate subjected to the heat treatment and the cleaning by electron beam deposition. The formed Al film was patterned to form gate electrodes to by a photolithography process. The photolithography process was performed in the following procedure.

On the Al film, AZ 5214 E (MicroChemicals), which is a positive type photoresist, was spin-coated at a slope of 1 second, 500 rpm for 5 seconds, 3000 rpm for 40 seconds, and 5000 rpm for 2 seconds, and the spin-coated PEN substrate was subjected to heat treatment on a hot plate at 105° C. for 70 seconds.

The PEN substrate on which AZ 5214 E was spin-coated was irradiated with ultraviolet light (λ=375 nm) by a maskless exposure machine (MLA 150 Maskless Aligner, Heidelberg Instruments), and then immersed in a developer (NMD-3, 2.38%, Tokyo Ohka Kogyo Co., Ltd.) and ultrapure water in this order for development.

The PEN substrate having the developed resist was immersed in a mixed acid Al etchant (Kanto Chemical Co., Inc.), wet-etched of the Al film was performed, and the resist was peeled off using an AZ (registered trademark) 100 Remover. The resist residue was removed by $UV/O_3$ treatment for 5 minutes, and parylene (diX-SR (registered trademark)) with a thickness of 120 nm was formed by a CVD method to form a gate-insulating film.

In the same manner as in Example 1, a PDMS stamp with a 10 cm square having a pattern for an n-type semiconductor was produced.

As the organic semiconductor, a powder of the n-type organic semiconductor $PhC_2$-BQQDI of Formula (20) above was prepared, an organic semiconductor solution was prepared in the same manner as in Example 1, and an organic semiconductor single crystal film having an average thickness of 10 nm, an area of 15 $cm^2$, and a single domain area of 10 $mm^2$ was formed on the first substrate.

The patterned organic semiconductor single crystal films were produced using the production apparatus shown in FIG. 39. The PDMS stamp produced was disposed in the stamp disposing part, the first substrate on which the organic semiconductor single crystal film (hereinafter also referred to as a semiconductor film) was formed was disposed in the first substrate disposing part, and the second substrate was disposed in the second substrate disposing part.

The first substrate was pressed against the produced stamp at a pressure of 10 kPa per area of the convex portions of the stamp so that the convex portions of the stamp were in contact with the semiconductor film. After pressing the first substrate against the stamp, a 30 wt % ethanol aqueous solution was then dropped at the interface between the first substrate and the semiconductor film, the semiconductor film was disposed on the convex portions of the stamp, and the first substrate was separated from the semiconductor film disposed on the convex portions.

The PEN substrate on which the gate electrodes and the gate insulating film were formed was disposed in the second substrate disposing part of FIG. 39, and the PDMS stamp on which the semiconductor film was transferred was disposed in the stamp disposing part.

The second substrate was moved to an appropriate position while observing alignment marks disposed on the gate electrode layer and the PDMS stamp by cameras disposed at four corners of a stamp suction stage. Next, while applying a load of 50 kPa per area of the convex portions of the stamp using the load cell, the stamp was pressed against the second substrate for 30 seconds so that the semiconductor films transferred on the convex portions of the PDMS stamp and the parylene on the second substrate were in contact with each other, the patterned semiconductor films were disposed on the second substrate, the stamp was separated from the semiconductor films disposed on the second substrate, and patterned organic semiconductor single crystal films 21 were obtained. Drying was performed in a vacuum oven at 80° C. for 10 hours. The obtained organic semiconductor single crystal films were neatly patterned and formed, and was 264 patterns having thicknesses of 6 to 20 nm, a width of 250 μm, lengths of 120 to 200 μm, and spacings between the semiconductor films of 20 to 200 μm.

Figure 37:
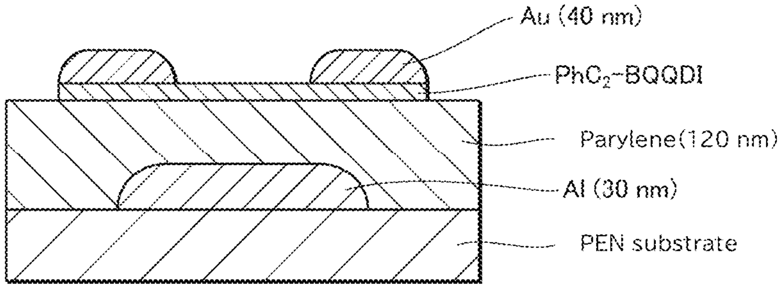
FIG. 37 is a cross-sectional schematic drawing of a BGTC type OFET including an n-type organic semiconductor produced in the Examples.

Au was then vacuum-deposited to a thickness of 50 nm on the entire surface, and the S/D electrodes were patterned by a photolithography process to produce a bottom gate top contact (BGTC) type organic field-effect transistor (OFET). FIG. 37 shows a cross-sectional schematic drawing of the obtained BGTC type OFET.

Figure 38:
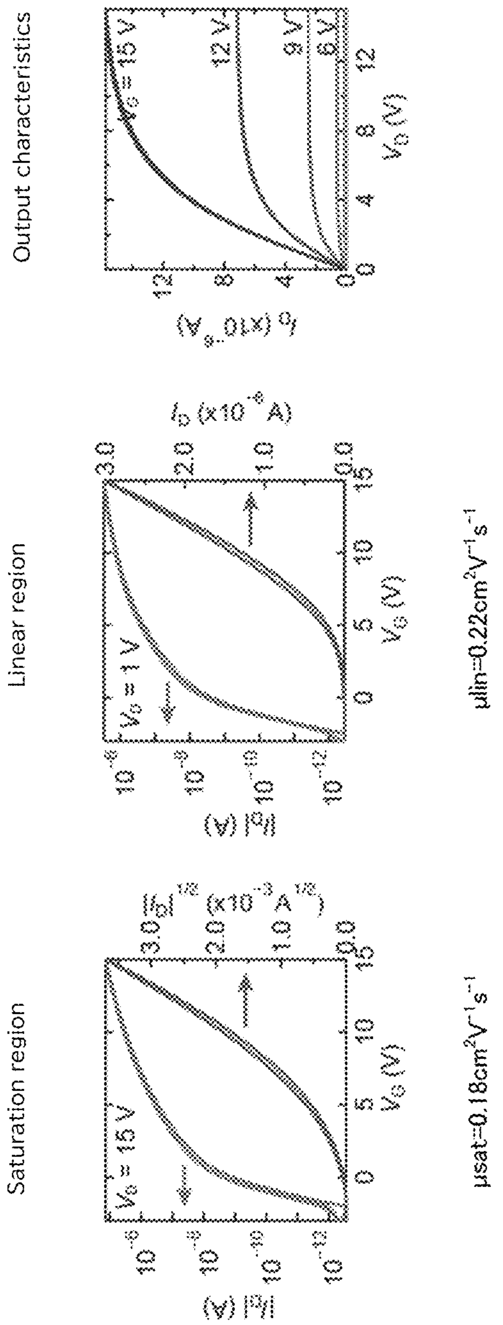
FIG. 38 is a graph of transfer characteristics representing the relationship between the gate voltage and the drain current in the saturation region, a graph of the transfer characteristics representing the relationship between the gate voltage and the drain current in the linear region, and a graph of the output characteristics representing the relationship between the drain voltage and the drain current depending on the gate voltage for the produced BGTC-type OFET.

FIG. 38 shows a graph of the transfer characteristics representing the relationship between the gate voltage and the drain current in the saturation region, a graph of the transfer characteristics representing the relationship between the gate voltage and the drain current in the linear region, and a graph of the output characteristics representing the relationship between the drain voltage and the drain current depending on the gate voltage of the produced BGTC type OFET. The mobility in the saturated region was 0.18 $cm^2/V\cdot s$, and the mobility in the linear region was 0.22 $cm^2/V\cdot s$.

Example 8

Patterned organic semiconductor single crystal films were obtained in the same manner as in Example 3 except that a stamp having widths of 20 μm, 40 μm, 50 μm, 100 μm, 150 μm, and 200 μm of the convex portions was used and the pressing pressure of the stamp on the first substrate was 10 kPa per the area of the convex portions of the stamp and the pressing pressure of the stamp on the second substrate was 50 kPa per the area of the convex portions of the stamp.

Figure 40:
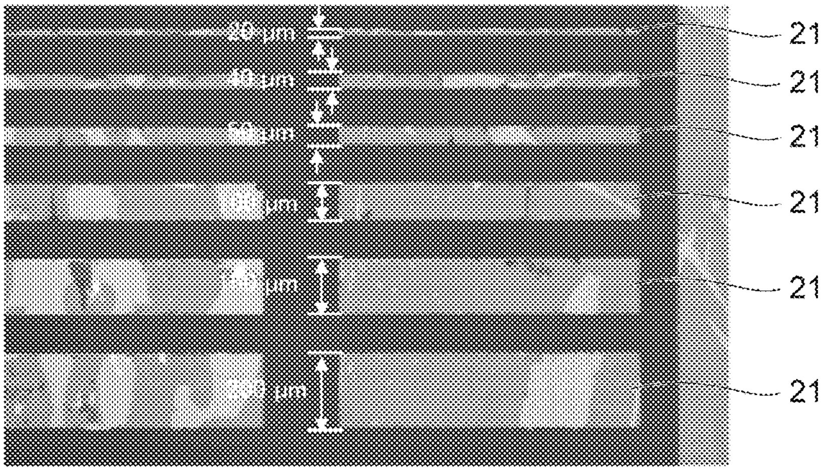
FIG. 40 is a polarized light microscopic image of the organic semiconductor single crystal film transferred on the second substrate observed from the top surface.

FIG. 40 shows a polarized light microscopic image obtained by observing the organic semiconductor single crystal films 21 transferred on the second substrate from the top surface of the organic semiconductor single crystal films 21. The obtained organic semiconductor single crystal films were neatly patterned and formed, and was in a pattern having a thickness of 12 nm, widths of 20 μm, 40 μm, 50 μm, 100 μm, 150 μm, and 200 μm, a length of 800 μm, and spacing of 100 μm between the semiconductor film.

Example 9

Patterned organic semiconductor single crystal films were obtained in the same manner as in Example 4 except that a stamp having spacing of 1 μm, 2 μm, 5 μm, 10 μm, and 20 μm between the convex portions was used and the pressing pressure of the stamp on the first substrate was 10 kPa per the area of the convex portions of the stamp and the pressing pressure of the stamp on the second substrate was 50 kPa per the area of the convex portions of the stamp.

Figure 41:
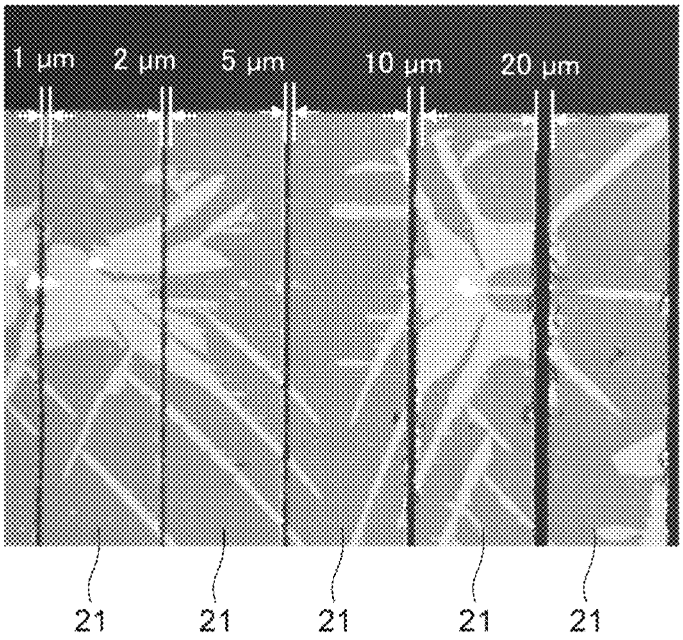
FIG. 41 is a polarized light microscopic image of the organic semiconductor single crystal film transferred on the second substrate observed from the top surface.

FIG. 41 shows a polarized light microscopic image obtained by observing the organic semiconductor single crystal films 21 transferred on the second substrate from the top surface of the organic semiconductor single crystal films 21. The obtained organic semiconductor single crystal films were neatly patterned and formed, and was in a pattern having a thickness of 12 nm, a width of 800 μm, a length of 200 μm, and spacings of 1 μm, 2 μm, 5 μm, 10 μm, and 20 μm between the semiconductor films.

Example 10

Patterned organic semiconductor single crystal films were obtained in the same manner as in Example 4 except that a stamp having the convex portions of 60 μm square, 80 μm square, 100 μm square, 300 μm square, and 500 μm square was used and the pressing pressure of the stamp on the first substrate was 10 kPa per area of the convex portions of the stamp and the pressing pressure of the stamp on the second substrate was 50 kPa per area of the convex portions of the stamp.

Figure 42:
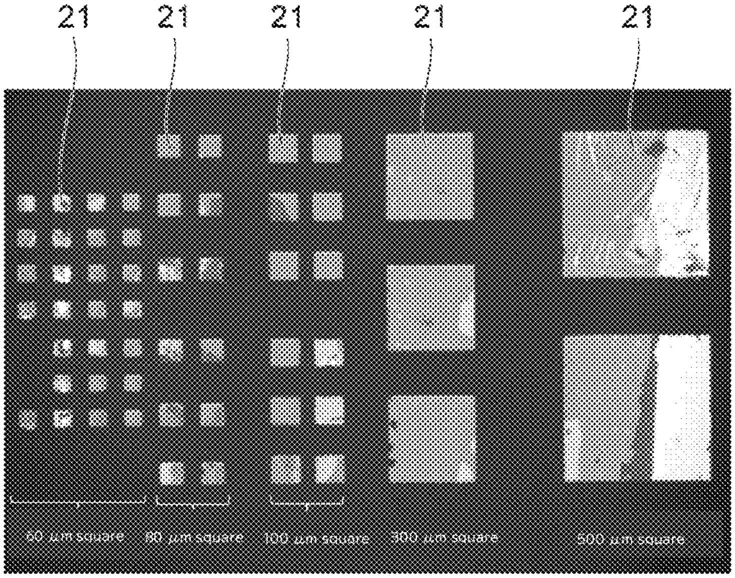
FIG. 42 is a polarized light microscopic image of the organic semiconductor single crystal film transferred on the second substrate observed from the top surface.

FIG. 42 shows a polarized light microscopic image obtained by observing the organic semiconductor single crystal films 21 transferred on the second substrate from the top surface of the organic semiconductor single crystal films 21. The obtained organic semiconductor single crystal films were neatly patterned and formed, with thicknesses of 8 to 12 nm and patterns of 60 μm square, 80 μm square, 100 μm square, 300 μm square, and 500 μm square.

Example 11

Patterned organic semiconductor single crystal films were obtained in the same manner as in Example 4 except that a stamp having the convex portions of 30 μm square, 40 μm square, and 50 μm square was used and the pressing pressure of the stamp on the first substrate was 10 kPa per the area of the convex portions of the stamp, and the pressing pressure of the stamp on the second substrate was 50 kPa per the area of the convex portions of the stamp.

Figure 43:
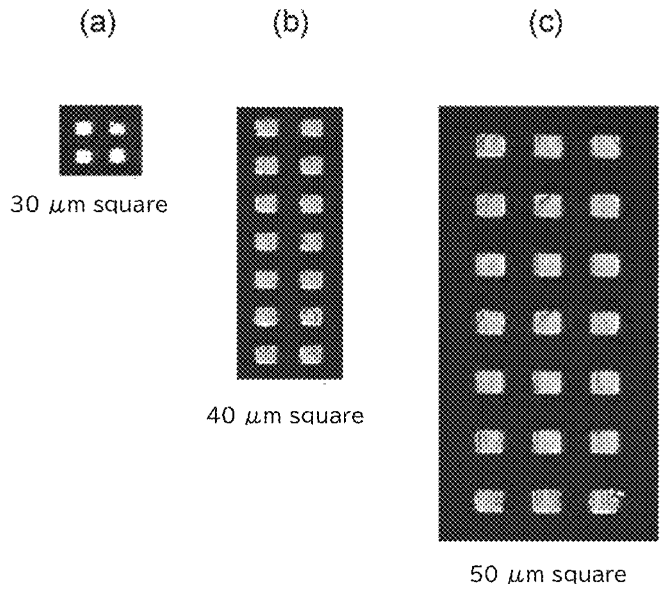
FIG. 43 is a polarized light microscopic image of the organic semiconductor single crystal film transferred on the second substrate observed from the top surface.

FIG. 43 shows a polarized light microscopic image obtained by observing the organic semiconductor single crystal films 21 transferred on the second substrate from the top surface of the organic semiconductor single crystal films 21. The obtained organic semiconductor single crystal films were neatly patterned and formed, with thicknesses of 8 to 12 nm and had patterns of 30 μm square, 40 μm square, and 50 μm square.

Example 12

(CMOS Logic Circuit: Fabrication of NOT, NOR, NAND, and DFF Circuit)

In the same manner as in Example 7, Al gate electrodes having a thickness of 30 nm and a gate insulating film of parylene (diX-SR (registered trademark)) having a thickness of 120 nm were formed on a PEN substrate.

In the same manner as in Example 7, a p-type organic semiconductor $C_9$-DNBDT-NW film was transferred onto the gate insulating film by a p-type stamp, and then an n-type organic semiconductor $PhC_2$-BQQDI film was transferred to the same layer by an n-type stamp. The obtained p-type organic semiconductor single crystal films were neatly patterned and formed, and had thicknesses of 8 to 12 nm, a width of 80 μm, and lengths of 124 to 200 μm. The obtained n-type organic semiconductor single crystal films were also neatly patterned and formed, and had thicknesses of 10 to 12 nm, a width of 250 μm, and lengths of 120 to 200 μm.

Figure 48:
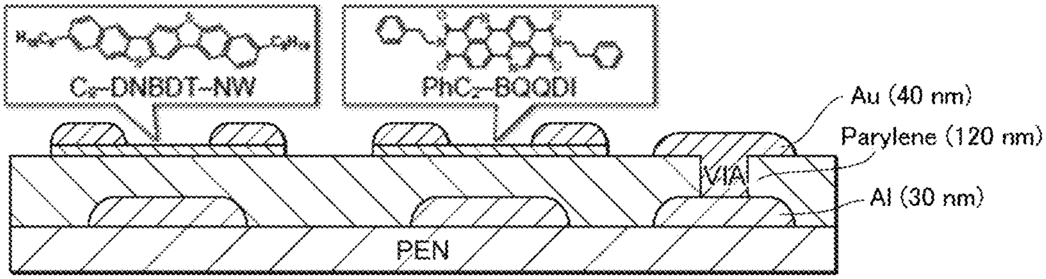
FIG. 48 is a cross-sectional schematic drawing of an organic complementary semiconductor device having a p-type organic transistor and an n-type organic transistor produced in the Examples.

After the gate insulating film was etched using a YAG laser to expose a part of the gate electrodes (Via (Vertical Interconnect Access) opening), Au was evaporated to a thickness of 50 nm on the entire surface, and the exposed gate electrode and the source/drain electrode layer were electrically connected to each other. Next, in the same manner as in Example 7, the source/drain electrodes of Au were patterned on the p-type organic semiconductor $C_9$-DNBDT-NW film and the n-type organic semiconductor $PhC_2$-BQQDI film to produce an organic complementary semiconductor device comprising a p-type organic transistor (p-TFT) and an n-type organic transistor (n-TFT). The L/W of the p-TFT was 12 μm/80 μm, and the L/W of the n-TFT was 8 μm/500 μm. FIG. 48 shows a cross-sectional schematic drawing of the produced device.

Figure 44:
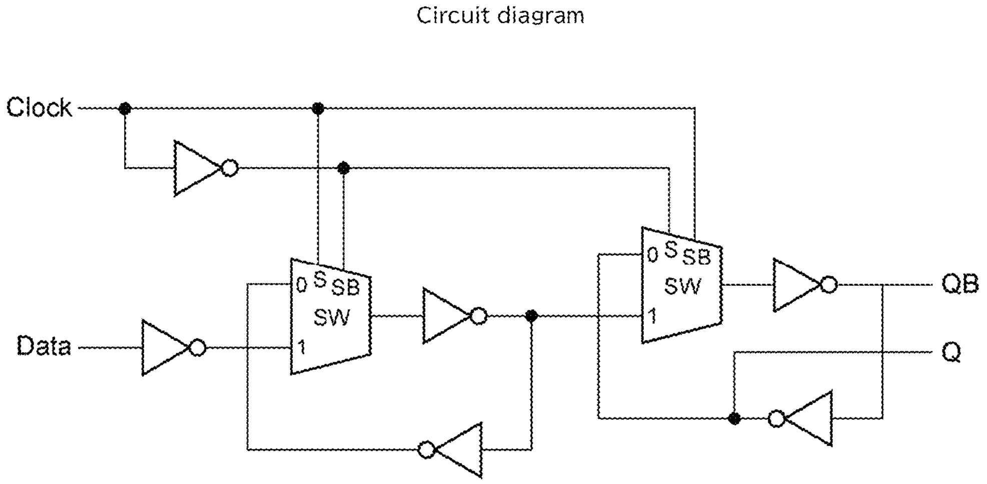
FIG. 44 is a circuit diagram of a DFF circuit produced in the Examples.
Figure 49:
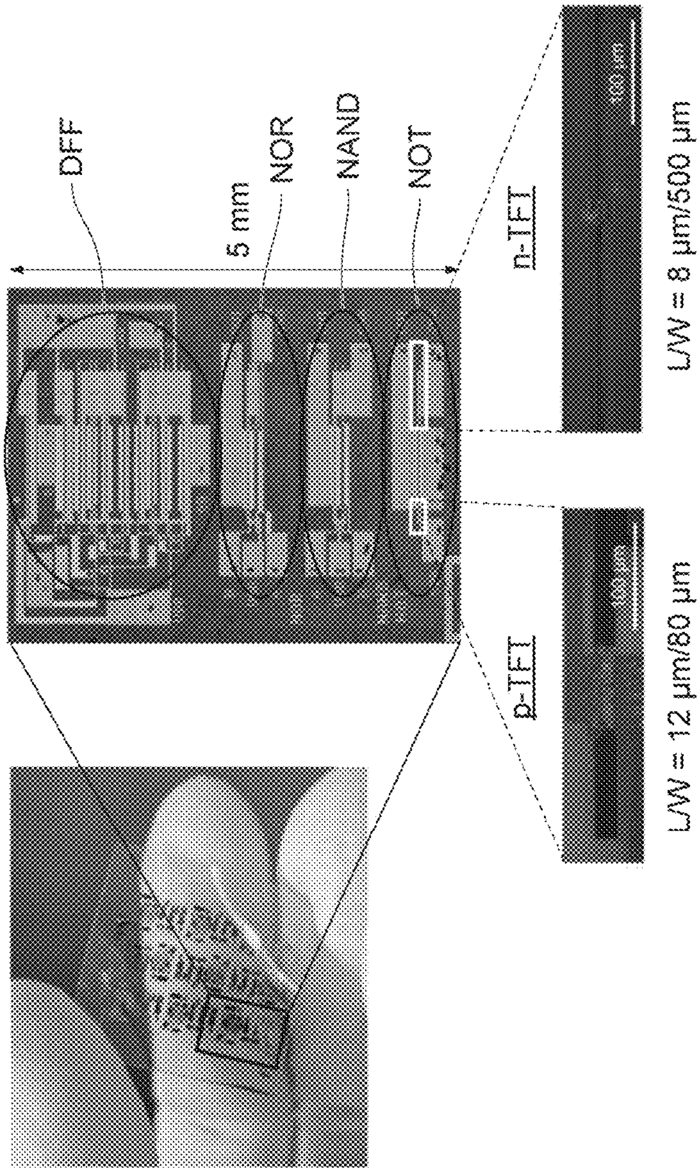
FIG. 49 is a drawing illustrating NOT, NOR, NAND, and DFF circuits produced on a flexible polyethylene naphthalate (PEN) substrate.

As shown in FIG. 49, a D flip-flop (DFF) circuit using NOT, NOR, NAND, and 2-to-1 selector composed of the organic complementary semiconductor device shown in FIG. 48 was produced in an area of 3 mm×5 mm on the flexible PEN substrate. FIG. 44 shows a circuit diagram of the produced DFF circuit.

Figures 45, 46:
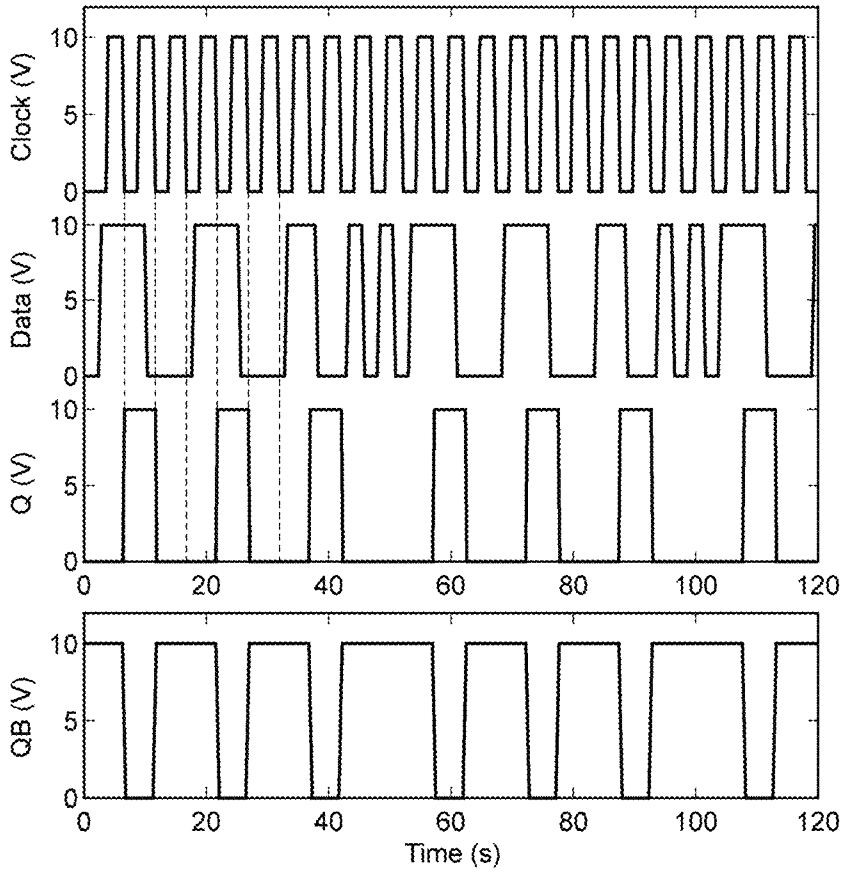
FIG. 45 is a truth table of a negative edge triggered DFF.
FIG. 46 is an operation check result at $V_{DD}$=10V.

FIG. 45 shows a truth table of the negative edge triggered DFF. FIG. 46 shows the operation check results at $V_{DD}$=10V. As shown in FIG. 46, the operation was confirmed that the Data signal was read into the output Q only at the timing when the Clock signal changed from H to L, and that the Data signal was not reflected in the output Q and the output Q was held at the time of the switching from L to H or at any other timing. Further, as for the output QB, a signal obtained by inverting the output Q was obtained. Therefore, it can be said that the negative edge trigger type DFF was successfully produced on the PEN substrate which is the flexible substrate.

Figure 47:
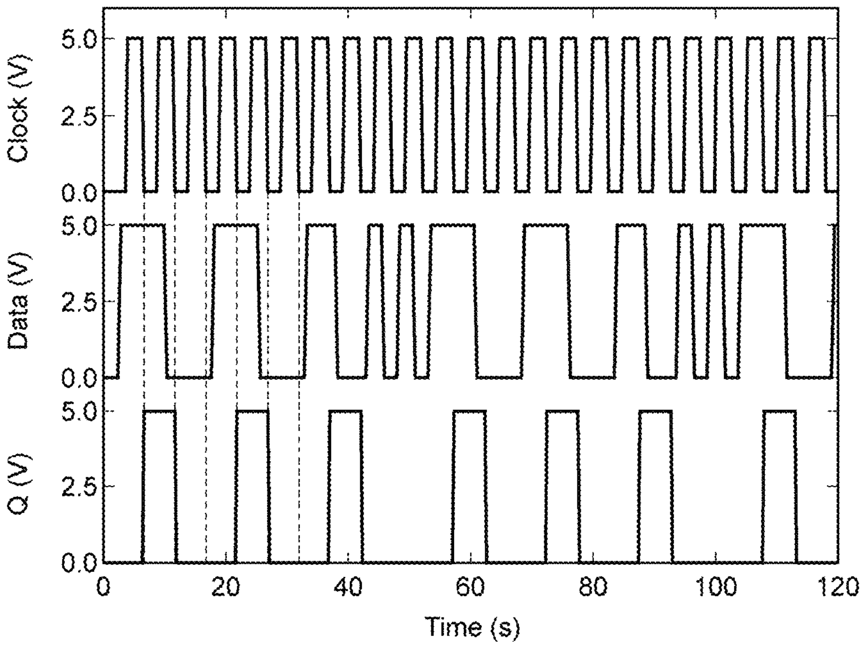
FIG. 47 is an operation check result at $V_{DD}$=5V.

Further, when the device was operated at $V_{DD}$ of 5 V, as shown in FIG. 47, outputs in which the voltage at the time of H was 5 V with the same waveforms as in FIG. 46 were obtained, and the device could be driven at a low voltage.

REFERENCE SIGNS LIST

10 first substrate
20 organic film
21 patterned organic film
22 organic film on concave portion
30 stamp
31 convex portion of stamp
32 concave portion of stamp
33 liquid stamp material
40 second substrate
42 hydrophobic film
50 mold
52 substrate for preparing mold
54 photoresist
56 release layer
57 support substrate
58 weight
60 electrode
70 space
80 water or aqueous solution supplier, or supply part of water or aqueous solution
82 water or aqueous solution
90 stamp disposing part
91 first substrate disposing part
92 second substrate disposing part
93 first driving part
94 control part
95 second driving part
96 second control part
100 production apparatus

The invention claimed is:

1. A method for producing a patterned organic film, comprising:
forming a hydrophobic organic film on a hydrophilic and non-water-soluble first substrate using a coating method,
pressing the organic film formed on the first substrate against a convex portion of a stamp having the convex portion and a concave portion,
transferring the organic film to the convex portion by applying water or an aqueous solution to an interface between the first substrate and the organic film, and
pressing the organic film transferred to the convex portion against a second substrate to transfer the organic film to the second substrate to obtain a patterned organic film,
wherein at least one of the organic film and the second substrate is an organic semiconductor.

2. The method according to claim 1, wherein a distance between an uppermost portion of the convex portion and a lowest portion of the concave portion is 2 to 100 μm.

3. The method according to claim 1, wherein the patterned organic film comprises 10 or more organic films, each organic film has a thickness of 2 nm or more, a width of 500 nm or more, and a length of 500 nm or more, and a distance between adjacent organic films is 1 μm or more.

4. An apparatus for producing a patterned organic film, comprising:
a stamp disposing part configured to dispose a stamp having a convex portion and a concave portion,
a first substrate disposing part configured to dispose a hydrophilic and non-water-soluble first substrate having an organic film on a surface of the first substrate,
a second substrate disposing part configured to dispose a second substrate,
a first driving part configured to move at least one of the first substrate and the stamp so as to press the organic film on the first substrate against the convex portion of the stamp to dispose the organic film on the convex portion and to separate the first substrate from the organic film disposed on the convex portion,
a first control part configured to control a force of pressing the organic film on the first substrate against the convex portion of the stamp,
a supply part of water or aqueous solution configured to supply the water or aqueous solution to an interface between the organic film and the first substrate,
a second driving part configured to move at least one of the stamp and the second substrate so as to press the organic film disposed on the convex portion of the stamp against the second substrate to dispose the patterned organic film on the second substrate and to separate the stamp from the patterned organic film disposed on the second substrate, and
a second control part configured to control a force of pressing the organic film disposed on the convex portion of the stamp against the second substrate.

5. The apparatus according to claim 4, wherein the first control part is configured to control a distribution of the force of pressing the organic film in a plane of the organic film when the organic film is pressed against the convex portion.

6. The apparatus according to claim 4, wherein the second control part is configured to control a distribution of the force of pressing the organic film in a plane of the organic film when the organic film is pressed against the second substrate.

7. The apparatus according to claim 4, wherein the apparatus comprises an amount adjusting part configured to be able to adjust the amount of the water or aqueous solution supplied by the supply part of the water or aqueous solution.

8. The apparatus according to claim 4, wherein the apparatus comprises a supply position adjusting part capable of recognizing a position of the interface for supplying the water or aqueous solution, and adjusting the position of the water or aqueous solution supplied by the supply part of the water or aqueous solution.

9. The apparatus according to claim 4, wherein the apparatus comprises a first alignment part controlling a position at which the organic film on the first substrate is pressed against the convex portion of the stamp.

10. The apparatus according to claim 4, wherein the apparatus comprises a second alignment part controlling a position at which the organic film on the convex portion of the stamp is pressed against the second substrate.

* * * * *